(12) United States Patent
Staszewki et al.

(10) Patent No.: US 10,447,285 B2
(45) Date of Patent: Oct. 15, 2019

(54) SOFTWARE RECONFIGURABLE DIGITAL PHASE LOCK LOOP ARCHITECTURE

(71) Applicant: TEXAS INSTRUMENTS INCORPORATED, Dallas, TX (US)

(72) Inventors: Roman Staszewki, McKinney, TX (US); Robert B. Staszewski, Dublin (IE); Fuqiang Shi, San Jose, CA (US)

( * ) Notice: Subject to any disclaimer, the term of this patent is extended or adjusted under 35 U.S.C. 154(b) by 0 days.

(21) Appl. No.: 16/137,850

(22) Filed: Sep. 21, 2018

(65) Prior Publication Data

US 2019/0020349 A1  Jan. 17, 2019

Related U.S. Application Data

(62) Division of application No. 15/816,408, filed on Nov. 17, 2017, now Pat. No. 10,122,371, which is a division of application No. 15/269,245, filed on Sep. 19, 2016, now Pat. No. 9,853,649, which is a division of application No. 14/800,174, filed on Jul. 15, 2015, now Pat. No. 9,473,155, which is a division of application No. 13/680,441, filed on Nov. 19, 2012, now Pat. No. 9,116,769, which is a division of
(Continued)

(51) Int. Cl.
| | |
|---|---|
| *H03L 7/099* | (2006.01) |
| *G06F 17/10* | (2006.01) |
| *H03L 7/197* | (2006.01) |
| *H04B 1/04* | (2006.01) |
| *H04W 56/00* | (2009.01) |
| *G06F 9/30* | (2018.01) |
| *G06F 7/60* | (2006.01) |
| *H04B 1/06* | (2006.01) |

(52) U.S. Cl.
CPC ............ *H03L 7/0992* (2013.01); *G06F 7/605* (2013.01); *G06F 9/30014* (2013.01); *G06F 9/30032* (2013.01); *G06F 9/30181* (2013.01); *G06F 17/10* (2013.01); *H03L 7/1974* (2013.01); *H03L 7/1976* (2013.01); *H04B 1/04* (2013.01); *H04W 56/003* (2013.01); *H03L 2207/50* (2013.01)

(58) Field of Classification Search
CPC ... H03L 7/0992; H03L 7/1974; H03L 7/1976; H03L 2207/50; G06F 7/605; G06F 9/30014; G06F 9/30032; G06F 9/30181; G06F 17/10; H04B 1/04; H04W 56/003
USPC .......................................... 455/260; 708/300
See application file for complete search history.

(56) References Cited

U.S. PATENT DOCUMENTS

| | | |
|---|---|---|
| 5,267,040 A | 11/1993 | Gossett |
| 5,546,431 A | 8/1996 | Bazes |
| 5,584,061 A | 12/1996 | Kimura et al. |

(Continued)

*Primary Examiner* — Lee Nguyen
(74) *Attorney, Agent, or Firm* — Lawrence J. Bassuk; Charles A. Brill; Frank D. Cimino

(57) ABSTRACT

A novel and useful apparatus for and method of software based phase locked loop (PLL). The software based PLL incorporates a reconfigurable calculation unit (RCU) that is optimized and programmed to sequentially perform all the atomic operations of a PLL or any other desired task in a time sharing manner. An application specific instruction-set processor (ASIP) incorporating the RCU includes an instruction set whose instructions are optimized to perform the atomic operations of a PLL. The RCU is clocked at a fast enough processor clock rate to insure that all PLL atomic operations are performed within a single PLL reference clock cycle.

4 Claims, 19 Drawing Sheets

Related U.S. Application Data application No. 11/853,575, filed on Sep. 11, 2007, now Pat. No. 8,321,489.

(60) Provisional application No. 60/825,838, filed on Sep. 15, 2006.

(56) References Cited

U.S. PATENT DOCUMENTS

| | | |
|---|---|---|
| 5,798,954 A | 8/1998 | Ishibata |
| 5,957,999 A | 9/1999 | Davis |
| 6,393,067 B1 | 5/2002 | Uesugi |
| 6,480,872 B1 | 11/2002 | Choquette |
| 6,678,709 B1 | 1/2004 | Gandhi et al. |
| 6,809,598 B1 | 10/2004 | Staszewski et al. |
| 6,847,378 B2 | 1/2005 | Oberoi et al. |
| 7,853,635 B2 | 12/2010 | Busaba et al. |
| 7,890,566 B1 | 2/2011 | Zbiciak |
| 8,024,394 B2 | 9/2011 | Prokopenko et al. |
| 8,321,489 B2 | 11/2012 | Staszewski |
| 9,116,769 B2 | 8/2015 | Staszewski et al. |
| 9,473,155 B2 | 10/2016 | Staszewski et al. |
| 9,853,649 B2 | 12/2017 | Staszewski |
| 2002/0026466 A1 | 2/2002 | Ohashi et al. |
| 2002/0131538 A1 | 9/2002 | Staszewski |
| 2006/0033582 A1 | 2/2006 | Staszewski et al. |
| 2006/0038710 A1 | 2/2006 | Staszewski et al. |
| 2006/0133559 A1 | 6/2006 | Glass |
| 2007/0085622 A1 | 4/2007 | Wallberg et al. |
| 2008/0068236 A1 | 3/2008 | Sheba et al. |
| 2009/0140782 A1* | 6/2009 | Huang .................. H03K 23/68 327/156 |

* cited by examiner

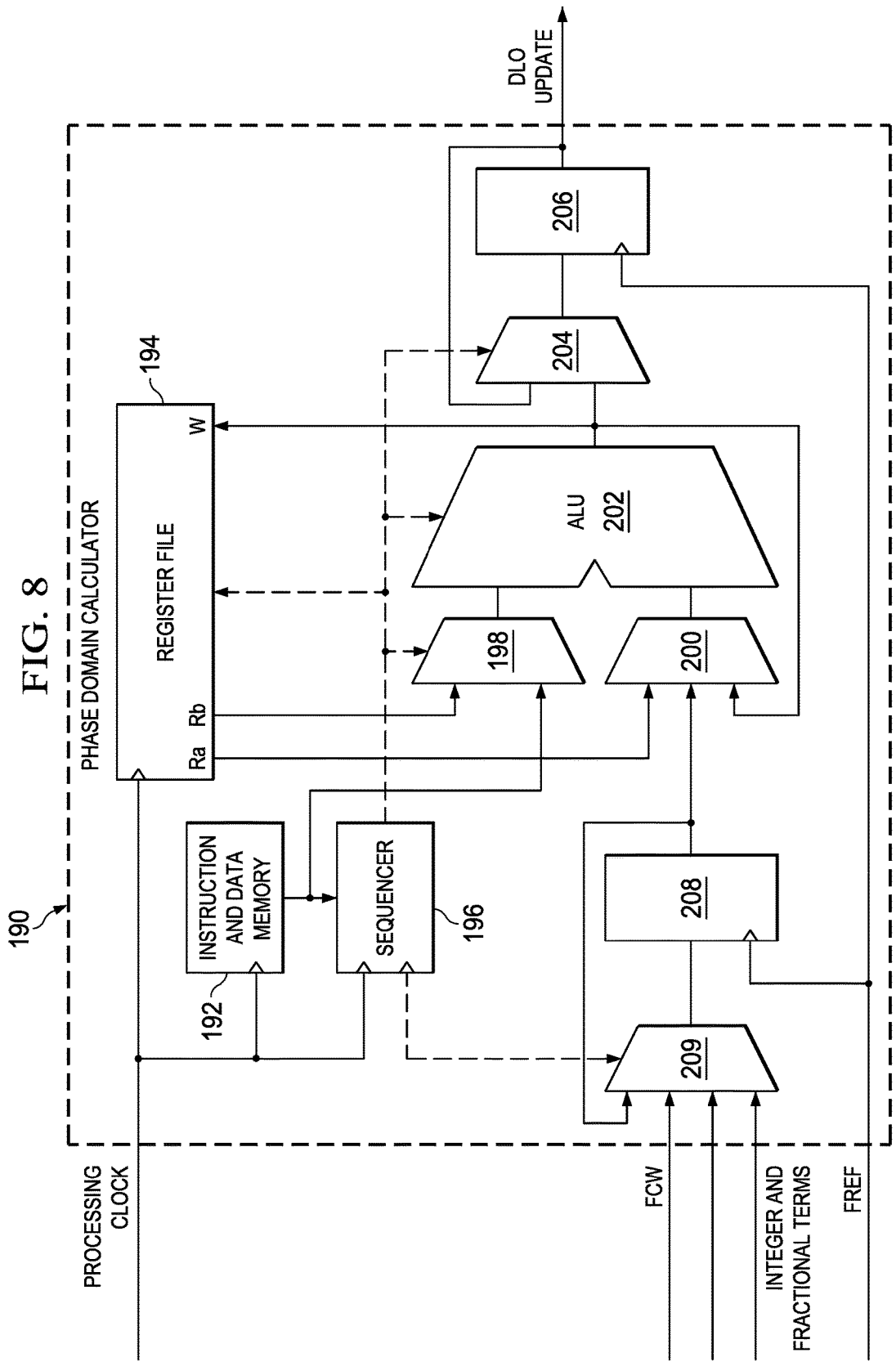

$$y_k = (1-a) \cdot y_{k-1} + a \cdot x_k$$
$$H(z) = \frac{a}{1-(a-1) \cdot z^{-1}}$$
FIG. 12A
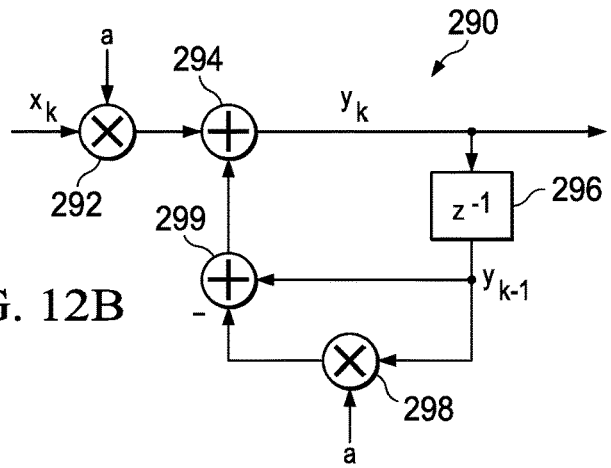
FIG. 12B
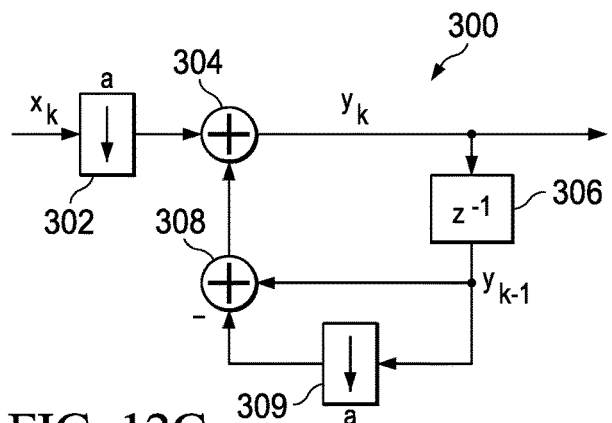
FIG. 12C
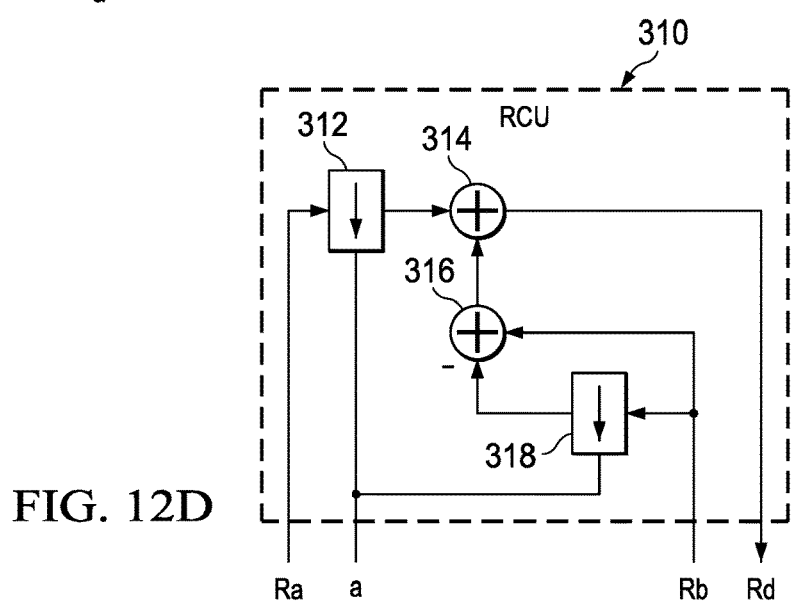
FIG. 12D

SOFTWARE RECONFIGURABLE DIGITAL PHASE LOCK LOOP ARCHITECTURE

REFERENCE TO PRIORITY APPLICATION

This application is a divisional application of and claims priority to U.S. non-provisional application Ser. No. 15/816,408, filed Nov. 17, 2017, currently pending;

Which is a divisional application of and claims priority to U.S. non-provisional application Ser. No. 15/269,245, filed Sep. 19, 2016, now U.S. Pat. No. 9,853,649, issued Dec. 26, 2017;

Which is a divisional application of and claims priority to U.S. non-provisional application Ser. No. 14/800,174, filed Jul. 15, 2015, now U.S. Pat. No. 9,473,155, granted Oct. 18, 2016;

Which is a divisional application of and claims priority to U.S. non-provisional application Ser. No. 13/680,441, filed Nov. 19, 2012, now U.S. Pat. No. 9,116,769, granted Aug. 25, 2015;

Which is a divisional application of and claims priority to U.S. non-provisional application Ser. No. 11/853,575, filed Sep. 11, 2007, now U.S. Pat. No. 8,321,489, granted Nov. 27, 2012;

which claims priority to U.S. Provisional Application Ser. No. 60/825,838, filed Sep. 15, 2006.

FIELD OF THE INVENTION

The present invention relates to the field of data communications and more particularly relates to a software reconfigurable all digital phase locked loop (ADPLL) architecture and application specific instruction-set processor related thereto.

BACKGROUND OF THE INVENTION

Phase locked loop (PLL) circuits are well known in the art. A block diagram illustrating an example prior art phase locked look (PLL) circuit is shown in FIG. 1. The typical PLL circuit, generally referenced 170, comprises phase detector 172, loop filter or low pass filter (LPF) 174 and voltage controlled oscillator (VCO) 176.

In operation, a frequency reference clock signal, often derived from a crystal oscillator, is input to the phase detector along with the VCO output signal (often divided down). The phase detector, typically implemented as a charge pump or mixer, generates a phase error (PHE) proportional to the phase difference between the reference clock input signal and the VCO output clock signal. The resultant PHE signal is then low pass filtered to yield a slow varying frequency command signal that controls the frequency of the VCO. The frequency command signal is input to a VCO or digitally controlled oscillator (DCO) such that the VCO output frequency/phase is locked to the reference clock with a certain fixed relationship. This oscillator generates an RF signal whose frequency depends on the frequency command signal.

In wireless communication systems, e.g., GSM, UMTS, Bluetooth, WiFi, etc., the RF synthesizer is a fundamental block that is used to provide a high quality, high frequency RF carrier for the transmitter and a local oscillator clock for the receiver, whose output frequency can range from several hundreds of MHz to several GHz. Different applications with different standards require different RF frequencies with different RF performance requirements. The RF clock generating the RF carrier plays a critical role in the entire wireless communication system. The quality of the RF clock directly affects the communication performance and often is the determining factor whether the system meets standards specifications.

Typically, the RF synthesizer is implemented using a phase locked loop (PLL) typically using a pure hardwired (i.e. fixed hardware with limited reconfigurability) design approach. All digital phase locked loops (ADPLLs) for RF synthesizer construction targeting wireless communications are known in the art. Conventional ADPLL circuits, however, are implemented as purely fixed hardware based (or hardwired) with very limited reconfigurability. It is thus difficult for one design to support multi-standard wireless applications, e.g., GSM, GPRS, EDGE, WCDMA, etc. as well as wireless data networks, such as Bluetooth, WiFi and WiMAX.

Once a hardwired circuit design is committed to a physical implementation, there is little that can be changed regarding the transfer function or operation of the ADPLL. Any modification requiring logic and interconnect change results in numerous time consuming steps within the ASIC creation process (i.e. timing closure, physical design, etc.) typically requiring significant engineering resources and months of delay to launch a product. In addition, once the silicon is manufactured, any change to the ADPLL architecture makes an even costlier impact, making such changes virtually impractical.

In general, a main difference between a hardwired implementation and a microprocessor based implementation is that the microprocessor implementation uses shared hardware running at higher speed, while the hardwired implementation uses dedicated hardware running at lower speed. A block diagram illustrating an example prior art generalized processing block using a dedicated hardware implementation is shown in FIG. 2. The hardwired implementation, generally referenced 10, comprises a plurality of dedicated hardware blocks 12 for each function 14. The circuit provides memory (Mem1, Mem2, Mem3, Mem4) and dedicated hardware for each function (F1, F2, F3, F4), wherein each block runs at the data path speed $f_s$.

A block diagram illustrating an example prior art generalized processing block using a processor based implementation is shown in FIG. 3. The circuit, generally referenced 16, comprises instruction memory 18, instruction fetch 20, instruction decode 22, ALU 24, data bus 29, register file 26 and data memory 28. The processor based solution has one shared hardware block ALU that can be configured to execute any of the four functions (F1, F2, F3, F4). The ALU is programmed by the instructions stored in instruction memory 18 and the ALU is adapted to run four times faster ($4f_s$) to complete the data processing within the data path speed of $f_s$.

It is important to note that the ALU 24 typically has a set of general purpose instructions which precludes its applicability in many applications, especially its use in RF synthesizer circuits.

With CMOS process technology currently advancing from 65 nm to 45 nm to 32 nm, transistors are becoming faster and faster. The interconnections, however, are becoming more and more dominant in SOC design regarding the delay and area contribution. The interconnections in a hardwired design having a large area will significantly slow the circuit speed while adding a significant silicon area overhead. Since processor based solutions run at higher speed with shared hardware, resulting in smaller area, advancements in semiconductor technology will make processor based solutions more and more attractive. This further favors use of multiple but smaller processors with a dedicated instruction set rather than one processor with a more general instruction set.

Furthermore, in conventional ADPLL circuits, the digital part of local oscillator (DLO) (i.e. a portion of the ADPLL) is implemented using dedicated random logic gates. Thus, all computations are launched on the rising edge of the ADPLL system reference clock and latched on the next rising edge. Since a majority of the circuit switching activity is centered on the rising edge of the system reference clock, most of the digital current is being switched at that point as well, creating large current transients. These digital current surges find their way into on-chip DCO and PA circuit nodes via various coupling mechanisms, e.g., capacitive, etc. These disturbances at the system clock rate have strong sub-harmonics that are upconverted into sensitive areas of the RF spectrum, resulting in unacceptable RF spurs.

It is thus desirable to have a processor based PLL architecture that is software based and programmable. The programmable PLL should provide a reconfiguration capability which eases silicon debugging and development tasks and provides multi-standard operation capability. Further, the software based PLL architecture should create significantly lower current transients thus reducing the generation of spurs in the output spectrum. At the same time, the unavoidable spurious energy that is generated by the logic activity and coupled into RF circuits should be pushed higher in frequency where they lie outside of or can be easily filtered out of critical frequency bands.

SUMMARY OF THE INVENTION

The present invention is a novel and useful apparatus for and method of software based phase locked loop (PLL). The processor-based PLL (i.e. all digital phase-locked loop or ADPLL) architecture described herein can be used for RF frequency synthesis in radio transceivers and other applications.

The software based phase locked loop of the present invention incorporates a reconfigurable calculation unit (RCU) that can be programmed to sequentially perform all the atomic operations of a phase locked loop or any other desired task. The RCU is a key component in a so called application specific instruction-set processor (ASIP). The ASIP includes an instruction set that comprises instructions optimized to perform the individual atomic operations of a phase locked loop.

The reconfigurable computational unit (RCU) is time shared for all computations within the phase locked loop. The reconfigurable computational unit and related configuration control logic replaces the dedicated and distributed random logic inside the conventional digital PLL. The reconfigurable computational unit is controlled via microcode stored in on-chip memory (e.g., RAM or ROM). Since the computational unit is time shared among all operations, it is operated at an oversampled rate that is high enough to insure the proper implementation of the phase locked loop. In order to achieve this, the reconfigurable computational unit is optimized to perform all computations of the phase locked loop atomic operations within a single reference clock cycle.

In one embodiment, the instruction set is implemented in microcode that is stored in volatile or non-volatile memory. Thus, the ASIP can easily be reconfigured to implement customized designs for different applications, such as multiple cellular standards, including GSM, GPRS, EDGE, WCDMA, Bluetooth, WiFi, etc., as well as wireless data network standards, including Bluetooth, WiFi, WiMAX, etc. The ASIP can be configured on the fly to handle the different RF frequency and performance requirements of each communication standard. The software based PLL of the present invention provides the flexibility for a more unified design that fits different applications.

In a second embodiment, the phase locked loop task is partitioned into a plurality of atomic operations. The ASIP is adapted to spread the computation of the atomic operations out over and completed within an entire PLL reference clock period. Each computation being performed at a much higher processor clock frequency than the PLL reference clock rate. This functions to significantly reduce the per cycle current transient generated by the computations. Further, the frequency content of the current transients is at the higher processor clock frequency. This results in a significant reduction in spurs within sensitive portions of the output spectrum.

An example application is provided of the software based phase locked loop incorporated in a single chip radio, e.g., Bluetooth, GSM, etc., that integrates the RF circuitry with the digital base band (DBB) circuitry on the same die.

Advantages of the software reconfigurable phase locked loop of the present invention include the following. Firstly, the invention enables all phase domain calculations to be performed within one reference clock cycle due to the use of the reconfigurable calculation unit optimized for performing PLL calculations serially at high frequency. Secondly, defining the ASIP instruction set in microcode stored in volatile or non-volatile memory makes it inherently software reconfigurable, permitting the microcode to be replaced without changing any lithography masks. The enables easier silicon debugging and multi-standard radio support.

Thirdly, the invention permits a significant reduction in silicon area. The invention trades the rate of operation for the amount of active implementation area required by the process of oversampling and function sharing. For an X factor increase in operational frequency, there is a complimentary X factor decrease in the required computational combinatorial logic area. An additional area is needed due to the overhead of computational unit multiplexing. While the storage area is constant, the net result is a significant reduction in overall implementation area required.

Fourthly, the invention enables a significant reduction of RF spurs in the sensitive frequency bands of a radio by changing the frequency of the switching logic gates. Prior art solutions perform PLL computations at relatively low rates, e.g., FREF of 26-38.8 MHz. The resulting switching current transients are mixed with the carrier and appear as frequency spurs at sensitive radio frequency bands. Considering GSM, for example, the most sensitive RX band is approximately 20 to 80 MHz away from the carrier. The invention performs the bulk of computations at oversampled rates, resulting in spurs outside sensitive regions. The amount of oversampling can be controlled (e.g., increased or decreased) to provide any desired frequency planning by changing the frequency of the processing clock. Fifthly, reduction in silicon area provided by the invention enables power routing and decoupling capacitance requirements to be relaxed.

Note that some aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application. Specific Integrated Circuit (ASIC) or Field Programmable Gate Array (FPGA), or as functionally equivalent discrete hardware components.

There is thus provided in accordance with the invention, a processor for use in a software based phase locked loop (PLL), comprising a first adder/subtractor operative to receive input data, a shifter operative to shift the output of the first adder/subtractor by a predetermined amount, a second adder/subtractor operative to receive the output of the shifter, a latch operative to store the output of the second adder/subtractor, a plurality of data paths connecting the first adder/subtractor, the shifter, the second adder/subtractor and the latch, the plurality of data paths configurable in accordance with one or more control signals and wherein the processor having an instruction set for controlling the first adder/subtractor, the shifter, the second adder/subtractor, the latch and the plurality of data paths.

There is also provided in accordance with the invention, a processor for use in a software based phase locked loop (PLL), comprising one or more computation units optimized for performing computations within a phase locked loop, wherein the one or more computation units are time-shared among all phase locked loop computations, data memory coupled to the one or more computation units, instruction memory coupled to the one or more computation units and operative to store instructions for implementing the phase locked loop, the instructions part of an instruction set and a decoder operative to generate one or more control signals for controlling the operation of the one or more computation units.

There is further provided in accordance with the invention, a processor based phase locked loop (PLL), comprising an oscillator operative to generate a radio frequency (RF) signal having a frequency determined in accordance with a tuning command input thereto, a processor operative to generate the tuning command, the processor comprising a reconfigurable calculation unit (RCU) operative to perform atomic operations required to implement the phase locked loop, data memory coupled to the reconfigurable calculation unit for storing phase locked loop state information, program memory coupled to the reconfigurable calculation unit for storing a plurality of instructions that when executed on the processor implement the phase locked loop and the processor having an instruction set, wherein each instruction is operative to perform an atomic operation of the phase locked loop.

There is also provided in accordance with the invention, a radio comprising a transmitter coupled to an antenna, the transmitter comprising a software based phase locked loop (PLL), the phase locked loop comprising an oscillator operative to generate a radio frequency (RF) signal having a frequency determined in accordance with a tuning command input thereto, a processor operative to generate the tuning command, the processor comprising a reconfigurable calculation unit (RCU) operative to perform atomic operations required to implement the phase locked loop, data memory coupled to the reconfigurable calculation unit for storing phase locked loop state information, program memory coupled to the reconfigurable calculation unit for storing a plurality of instructions that when executed on the processor implement the phase locked loop, the processor having an instruction set, wherein each instruction is operative to perform an atomic operation of the phase locked loop, a receiver coupled to the antenna and a baseband processor coupled to the transmitter and the receiver.

BRIEF DESCRIPTION OF THE DRAWINGS

The invention is herein described, by way of example only, with reference to the accompanying drawings, wherein:

FIG. 8 is a block diagram illustrating an example embodiment of the phase domain calculator of the present invention in more detail;

FIG. 12A is a diagram illustrating the output and transfer function equations for the infinite impulse response (IIR) filter portion of the ADPLL;

FIG. 12B is an equivalent block diagram implementing the output equation shown in FIG. 12A;

FIG. 12C is an equivalent block diagram implementing the output equation shown in FIG. 12A whereby the multiplication operations have been replaced with shift operations;

FIG. 12D is a diagram illustrating the resultant reconfigurable calculation unit (RCU) implementing the output equation shown in FIG. 12A;

DETAILED DESCRIPTION OF THE INVENTION

Notation Used Throughout

Figure 1:
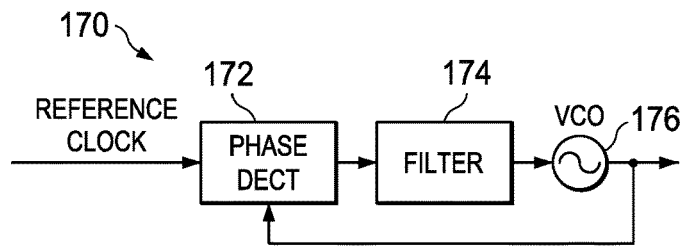
FIG. 1 is a block diagram illustrating a simplified block diagram of an example prior art phase locked look (PLL) circuit.
Figure 2:
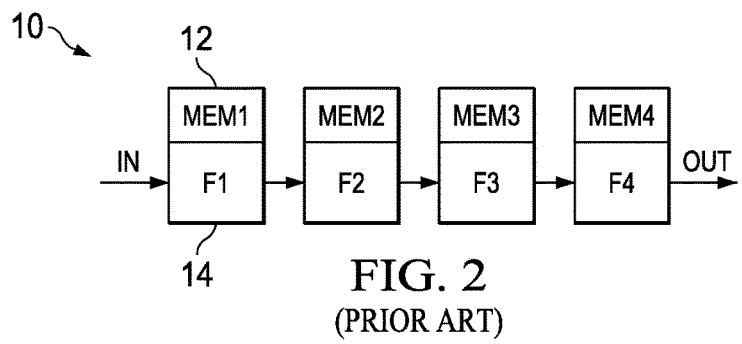
FIG. 2 is a block diagram illustrating an example prior art generalized processing block using a dedicated hardware implementation.
Figure 3:
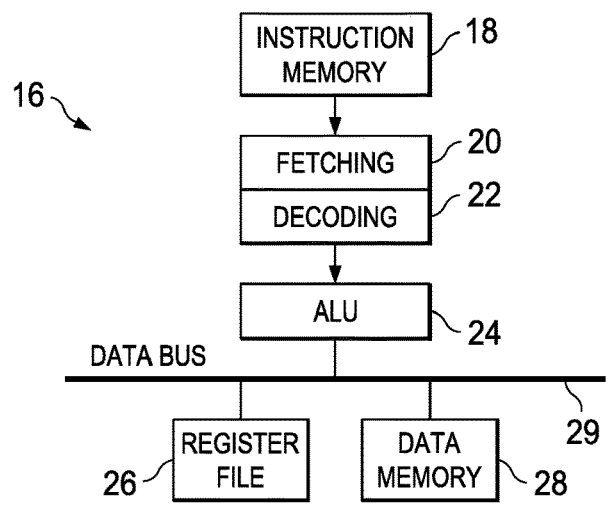
FIG. 3 is a block diagram illustrating an example prior art generalized processing block using a processor based implementation.

The following notation is used throughout this document.

| Term | Definition |
| --- | --- |
| AC | Alternating Current |
| ACL | Asynchronous Connectionless Link |
| ACW | Amplitude Control Word |
| ADC | Analog to Digital Converter |
| ADPLL | All Digital Phase Locked Loop |
| ALU | Arithmetic Logic Unit |
| AM | Amplitude Modulation |
| ASIC | Application Specific Integrated Circuit |
| ASIP | Application Specific Instruction-set Processor |
| AVI | Audio Video Interface |
| AWS | Advanced Wireless Services |
| BIST | Built-In Self Test |
| BMP | Windows Bitmap |
| BPF | Band Pass Filter |
| CMOS | Complementary Metal Oxide Semiconductor |
| CPU | Central Processing Unit |
| CU | Control Unit |
| CW | Continuous Wave |
| DAC | Digital to Analog Converter |
| dB | Decibel |
| DBB | Digital Baseband |
| DC | Direct Current |
| DCO | Digitally Controlled Oscillator |
| DCXO | Digitally Controlled Crystal Oscillator |
| DPA | Digitally Controlled Power Amplifier |
| DRAC | Digital to RF Amplitude Conversion |
| DRP | Digital RF Processor or Digital Radio Processor |
| DSL | Digital Subscriber Line |
| DSP | Digital Signal Processor |
| EDGE | Enhanced Data Rates for GSM Evolution |
| EDR | Enhanced Data Rate |
| EEPROM | Electrically Erasable Programmable Read Only Memory |
| EPROM | Erasable Programmable Read Only Memory |
| eSCO | Extended Synchronous Connection-Oriented |
| FCC | Federal Communications Commission |
| FCW | Frequency Command Word |
| FIB | Focused Ion Beam |
| FM | Frequency Modulation |
| FPGA | Field Programmable Gate Array |
| FSM | Finite State Machine |
| GMSK | Gaussian Minimum Shift Keying |
| GPRS | General Packet Radio Service |
| GPS | Global Positioning System |
| GSM | Global System for Mobile communications |
| HB | High Band |
| HDL | Hardware Description Language |
| HFP | Hands Free Protocol |
| I/F | Interface |
| IC | Integrated Circuit |
| IEEE | Institute of Electrical and Electronics Engineers |
| IIR | Infinite Impulse Response |
| JPG | Joint Photographic Experts Group |
| LAN | Local Area Network |
| LB | Low Band |
| LDO | Low Drop Out |
| LNA | Low Noise Amplifier |
| LO | Local Oscillator |
| LPF | Low Pass Filter |
| MAC | Media Access Control |
| MAP | Media Access Protocol |
| MBOA | Multiband OFDM Alliance |
| MIM | Metal Insulator Metal |
| Mod | Modulo |
| MOS | Metal Oxide Semiconductor |
| MP3 | MPEG-1 Audio Layer 3 |
| MPG | Moving Picture Experts Group |
| MUX | Multiplexer |
| NZIF | Near Zero IF |
| OFDM | Orthogonal Frequency Division Multiplexing |
| PA | Power Amplifier |
| PAN | Personal Area Network |
| PC | Personal Computer |
| PCI | Personal Computer Interconnect |
| PD | Phase Detector |
| PDA | Personal Digital Assistant |
| PE | Phase Error |
| PHE | Phase Error |
| PLL | Phase Locked Loop |
| PM | Phase Modulation |
| PPA | Pre-Power Amplifier |
| QoS | Quality of Service |
| RAM | Random Access Memory |
| RCU | Reconfigurable Calculation Unit |
| RF | Radio Frequency |
| RFBIST | RF Built-In Self Test |
| RMS | Root Mean Squared |
| ROM | Read Only Memory |
| SAM | Sigma-Delta Amplitude Modulation |
| SAW | Surface Acoustic Wave |
| SCO | Synchronous Connection-Oriented |
| SEM | Spectral Emission Mask |
| SIM | Subscriber Identity Module |
| SoC | System on Chip |
| SRAM | Static Read Only Memory |
| SYNTH | Synthesizer |
| TDC | Time to Digital Converter |
| TDD | Time Division Duplex |
| TV | Television |
| UART | Universal Asynchronous Transmitter/Receiver |
| UGS | Unsolicited Grant Services |
| UMTS | Universal Mobile Telecommunications System |
| USB | Universal Serial Bus |
| UWB | Ultra Wideband |
| VCO | Voltage Controlled Oscillator |
| WCDMA | Wideband Code Division Multiple Access |
| WiFi | Wireless Fidelity |
| WiMAX | Worldwide Interoperability for Microwave Access |
| WiMedia | Radio platform for UWB |
| WLAN | Wireless Local Area Network |
| WMA | Windows Media Audio |
| WMAN | Wireless Metropolitan Area Network |
| WMV | Windows Media Video |
| WPAN | Wireless Personal Area Network |
| XOR | Exclusive Or |
| ZIF | Zero IF |

DETAILED DESCRIPTION OF THE INVENTION

The present invention is a novel and useful apparatus for and method of software based phase locked loop (PLL). The processor-based (or software-based) PLL (i.e. all digital phase-locked loop or ADPLL) architecture can be used for RF frequency synthesis in radio transceivers and other applications. The software based phase locked loop of the present invention incorporates a reconfigurable calculation unit (RCU) that is programmed to sequentially perform all the atomic operations of a phase locked loop or of any other desired task. The RCU is a key component in an application specific instruction-set processor (ASIP). The ASIP includes an instruction set that comprises instructions optimized to perform the individual atomic operations of a phase locked loop.

An example application is provided of the software based phase locked loop incorporated in a single chip radio, e.g., Bluetooth, GSM, etc., that integrates the RF circuitry with the digital base band (DBB) circuitry on the same die.

Although the software based phase locked loop mechanism is applicable to numerous wireless communication standards and can be incorporated in numerous types of wireless or wired communication devices such a multimedia player, mobile station, cellular phone, PDA, DSL modem, WPAN device, etc., it is described in the context of a digital RF processor (DRP) based transceiver that may be adapted to comply with a particular wireless communications standard such as GSM, Bluetooth, EDGE, WCDMA, WLAN, WiMax, etc. It is appreciated, however, that the invention is not limited to use with any particular communication standard and may be used in optical, wired and wireless applications. Further, the invention is not limited to use with a specific modulation scheme but is applicable to numerous modulation schemes.

Note that throughout this document, the term communications device is defined as any apparatus or mechanism adapted to transmit, receive or transmit and receive data through a medium. The term communications transceiver or communications device is defined as any apparatus or mechanism adapted to transmit and receive data through a medium. The communications device or communications transceiver may be adapted to communicate over any suitable medium, including wireless or wired media. Examples of wireless media include RF, infrared, optical, microwave, UWB, Bluetooth, WiMAX, WiMedia, WiFi, or any other broadband medium, etc. Examples of wired media include twisted pair, coaxial, optical fiber, any wired interface (e.g., USB, Firewire, Ethernet, etc.). The term Ethernet network is defined as a network compatible with any of the IEEE 802.3 Ethernet standards, including but not limited to 10Base-T, 100Base-T or 1000Base-T over shielded or unshielded twisted pair wiring. The terms communications channel, link and cable are used interchangeably. The notation DRP is intended to denote either a Digital RF Processor or Digital Radio Processor. References to a Digital RF Processor infer a reference to a Digital Radio Processor and vice versa.

The term multimedia player or device is defined as any apparatus having a display screen and user input means that is capable of playing audio (e.g., MP3, WMA, etc.), video (AVI, MPG, WMV, etc.) and/or pictures (JPG, BMP, etc.). The user input means is typically formed of one or more manually operated switches, buttons, wheels or other user input means. Examples of multimedia devices include pocket sized personal digital assistants (PDAs), personal media player/recorders, cellular telephones, handheld devices, and the like.

Some portions of the detailed descriptions which follow are presented in terms of procedures, logic blocks, processing, steps, and other symbolic representations of operations on data bits within a computer memory. These descriptions and representations are the means used by those skilled in the data processing arts to most effectively convey the substance of their work to others skilled in the art. A procedure, logic block, process, etc., is generally conceived to be a self-consistent sequence of steps or instructions leading to a desired result. The steps require physical manipulations of physical quantities. Usually, though not necessarily, these quantities take the form of electrical or magnetic signals capable of being stored, transferred, combined, compared and otherwise manipulated in a computer system. It has proven convenient at times, principally for reasons of common usage, to refer to these signals as bits, bytes, words, values, elements, symbols, characters, terms, numbers, or the like.

It should be born in mind that all of the above and similar terms are to be associated with the appropriate physical quantities they represent and are merely convenient labels applied to these quantities. Unless specifically stated otherwise as apparent from the following discussions, it is appreciated that throughout the present invention, discussions utilizing terms such as 'processing,' 'computing,' 'calculating,' 'determining,' 'displaying' or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention can take the form of an entirely hardware embodiment, an entirely general-purpose software embodiment or an embodiment containing a combination of hardware and software elements. In one embodiment, a portion of the mechanism of the invention is implemented in software, which includes but is not limited to firmware, resident software, object code, assembly code, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium is any apparatus that can contain, store, communicate, propagate, or transport the program for use by or in connection with the instruction execution system, apparatus, or device, e.g., floppy disks, removable hard drives, computer files comprising source code or object code, flash semiconductor memory (USB flash drives, etc.), ROM, EPROM, or other semiconductor memory devices.

Single Chip Radio

Figure 4:
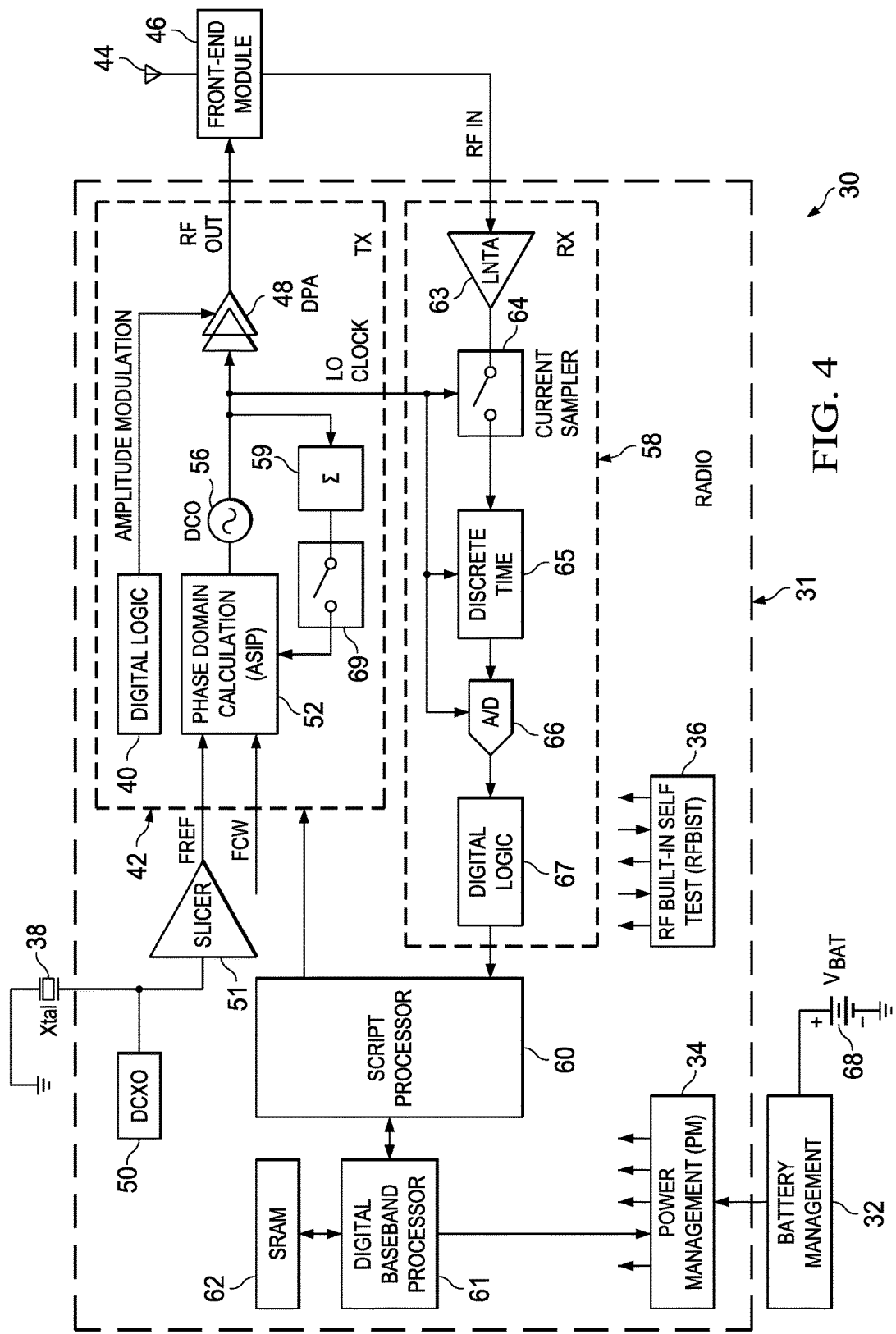
FIG. 4 is a block diagram illustrating a single chip polar transceiver radio incorporating a software based ADPLL mechanism of the present invention.

A block diagram illustrating a single chip radio incorporating a software based ADPLL mechanism of the present invention is shown in FIG. 4. For illustration purposes only, the transmitter, as shown, is adapted for the GSM/EDGE/WCDMA cellular standards. It is appreciated, however, that one skilled in the communication arts can adapt the transmitter and receiver illustrated herein to other modulations and communication standards as well without departing from the spirit and scope of the present invention.

The radio, generally referenced 30, comprises a radio integrated circuit 31 coupled to a crystal 38, RF front end module 46 coupled to an antenna 44, and battery management circuit 32 coupled to battery 68. The radio chip 31 comprises a script processor 60, digital baseband (DBB) processor 61, memory 62 (e.g., static RAM), TX block 42, RX block 58, digitally controlled crystal oscillator (DCXO) 50, slicer 51, power management unit 34 and RF built-in self test (BIST) 36. The TX block comprises high speed and low speed digital logic block 40 including ΣΔ modulators (not shown), phase domain calculator (ASIP) 52, digitally controlled oscillator (DCO) 56, accumulator 59, sampler 69 and digitally controlled power amplifier (DPA) 48. The RX block comprises a low noise transconductance amplifier 63, current sampler 64, discrete time processing block 65, analog to digital converter (ADC) 66 and digital logic block 67.

The principles presented herein have been used to develop three generations of a Digital RF Processor (DRP): single-chip Bluetooth, GSM and GSM/EDGE radios realized in 130 nm, 90 nm and 65 nm digital CMOS process technologies, respectively. This architecture is also used as the foundation for a UMTS single-chip radio manufactured using a 45 nm CMOS process. The common architecture is highlighted with features added specific to the cellular radio. The all digital phase locked loop (ADPLL) based transmitter employs a polar architecture with all digital phase/frequency and amplitude modulation paths. The receiver employs a discrete-time architecture in which the RF signal is directly sampled and processed using analog and digital signal processing techniques.

A key component is the digitally controlled oscillator (DCO) 56, which avoids any analog tuning controls. A digitally-controlled crystal oscillator (DCXO) generates a high-quality base station-synchronized frequency reference such that the transmitted carrier frequencies and the received symbol rates are accurate to within 0.1 ppm. Fine frequency resolution for both DCO and DCXO is achieved through high-speed ΣΔ dithering of their varactors. Digital logic built around the DCO realizes an all-digital PLL (ADPLL) that is used as a local oscillator for both the transmitter and receiver. The polar transmitter architecture utilizes the wideband direct frequency modulation capability of the ADPLL and a digitally controlled power amplifier (DPA) 48 for the amplitude modulation. The DPA operates in near-class-E mode and uses an array of nMOS transistor switches to regulate the RF amplitude. It is followed by a matching network and an external front-end module 46, which comprises a power amplifier (PA), a transmit/receive switch for the common antenna 44 and RX surface acoustic wave (SAW) filters. Fine amplitude resolution is achieved through high-speed ΣΔ dithering of the DPA nMOS transistors.

The receiver 58 employs a discrete-time architecture in which the RF signal is directly sampled at the Nyquist rate of the RF carrier and processed using analog and digital signal processing techniques. The transceiver is integrated with a script processor 60, dedicated digital base band processor 61 (i.e. ARM family processor and/or DSP) and SRAM memory 62. The script processor handles various TX and RX calibration, compensation, sequencing and lower-rate data path tasks and encapsulates the transceiver complexity in order to present a much simpler software programming model.

The frequency reference (FREF) is generated on-chip by a 26 MHz (or any other desired frequency, such as 13 or 38.4 MHz) digitally controlled crystal oscillator (DCXO) 50, which provides negative resistance to sustain the oscillations. The output of the DCXO is coupled to slicer 51. The output of the slicer is input to the phase domain calculator which comprises a software based PLL in accordance with the invention and described in more detail infra.

An integrated power management (PM) system 34 is connected to an external battery management circuit 32 that conditions and stabilizes the supply voltage. The PM comprises multiple low drop out (LDO) regulators that provide internal supply voltages and also isolate supply noise between circuits, especially protecting the DCO. The RF built-in self-test (RFBIST) 36 performs autonomous phase noise and modulation distortion testing, various loopback configurations for bit-error rate measurements and implements the DPA calibration and BIST mechanism. The transceiver is integrated with the digital baseband, SRAM memory in a complete system-on-chip (SoC) solution. Almost all the clocks on this SoC are derived from and are synchronous to the RF oscillator clock. This helps to reduce susceptibility to the noise generated through clocking of the massive digital logic.

The transmitter comprises a polar architecture in which the amplitude and phase/frequency modulations are implemented in separate paths. Transmitted symbols generated in the digital baseband (DBB) processor are first pulse-shape filtered in the Cartesian coordinate system. The filtered in-phase (I) and quadrature (Q) samples are then converted through a CORDIC algorithm into amplitude and phase samples of the polar coordinate system. The phase is then differentiated to obtain frequency deviation. The polar signals are subsequently conditioned through signal processing to sufficiently increase the sampling rate in order to reduce the quantization noise density and lessen the effects of the modulating spectrum replicas.

A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, Staszewski et al., entitled "Hybrid Polar/Cartesian Digital Modulator" and U.S. Pat. No. 6,809,598, to Staszewski et al., entitled "Hybrid Of Predictive And Closed-Loop Phase-Domain Digital PLL Architecture," all of which are incorporated herein by reference in their entirety.

Mobile Device/Cellular Phone/PDA System

Figure 5:
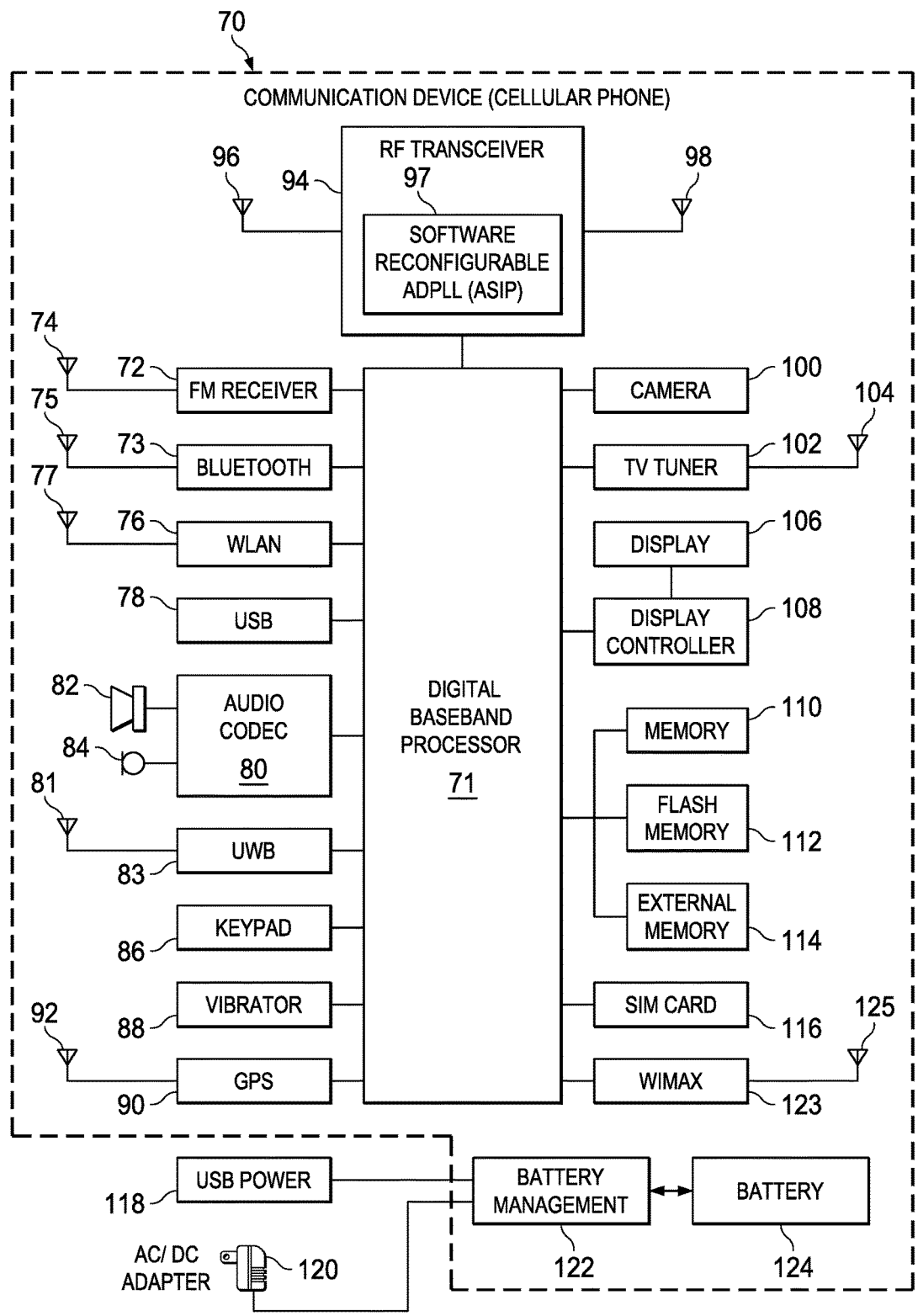
FIG. 5 is a simplified block diagram illustrating an example mobile communication device incorporating the software based ADPLL mechanism of the present invention.

A simplified block diagram illustrating an example mobile communication device incorporating the software based ADPLL mechanism of the present invention is shown in FIG. 5. The communication device may comprise any suitable wired or wireless device such as a multimedia player, mobile station, mobile device, cellular phone, PDA, wireless personal area network (WPAN) device, Bluetooth EDR device, etc. For illustration purposes only, the communication device is shown as a cellular phone or smart phone. Note that this example is not intended to limit the scope of the invention as the software based ADPLL mechanism of the present invention can be implemented in a wide variety of wireless and wired communication devices.

The cellular phone, generally referenced 70, comprises a baseband processor or CPU 71 having analog and digital portions. The basic cellular link is provided by the RF transceiver 94 and related one or more antennas 96, 98. A plurality of antennas is used to provide antenna diversity which yields improved radio performance. The cell phone also comprises internal RAM and ROM memory 110, Flash memory 112 and external memory 114.

In accordance with the invention, the RF transceiver 94 comprises the software reconfigurable ADPLL of the present invention. In operation, the software reconfigurable ADPLL mechanism may be implemented as dedicated hardware, as software executed as a task on the baseband processor 71 or dedicated processor or a combination of hardware and software. Implemented as a software task, the program code operative to implement the software reconfigurable ADPLL mechanism of the present invention is stored in one or more memories 110, 112, 114 or in on-chip volatile or non-volatile memory.

Several user interface devices include microphone 84, speaker 82 and associated audio codec 80, a keypad for entering dialing digits 86, vibrator 88 for alerting a user, camera and related circuitry 100, a TV tuner 102 and associated antenna 104, display 106 and associated display controller 108 and GPS receiver 90 and associated antenna 92.

A USB interface connection 78 provides a serial link to a user's PC or other device. An FM receiver 72 and antenna 74 provide the user the ability to listen to FM broadcasts. WLAN radio and interface 76 and antenna 77 provide wireless connectivity when in a hot spot or within the range of an ad hoc, infrastructure or mesh based wireless LAN network. A Bluetooth EDR radio and interface 73 and antenna 75 provide Bluetooth wireless connectivity when within the range of a Bluetooth wireless network. Further, the communication device 70 may also comprise a WiMAX radio and interface 123 and antenna 125. SIM card 116 provides the interface to a user's SIM card for storing user data such as address book entries, etc. The communication device 70 also comprises an Ultra Wideband (UWB) radio and interface 83 and antenna 81. The UWB radio typically comprises an MBOA-UWB based radio.

Portable power is provided by the battery 124 coupled to battery management circuitry 122. External power is provided via USB power 118 or an AC/DC adapter 120 connected to the battery management circuitry which is operative to manage the charging and discharging of the battery 124.

Example ADPLL Polar Transmitter

Figure 6:
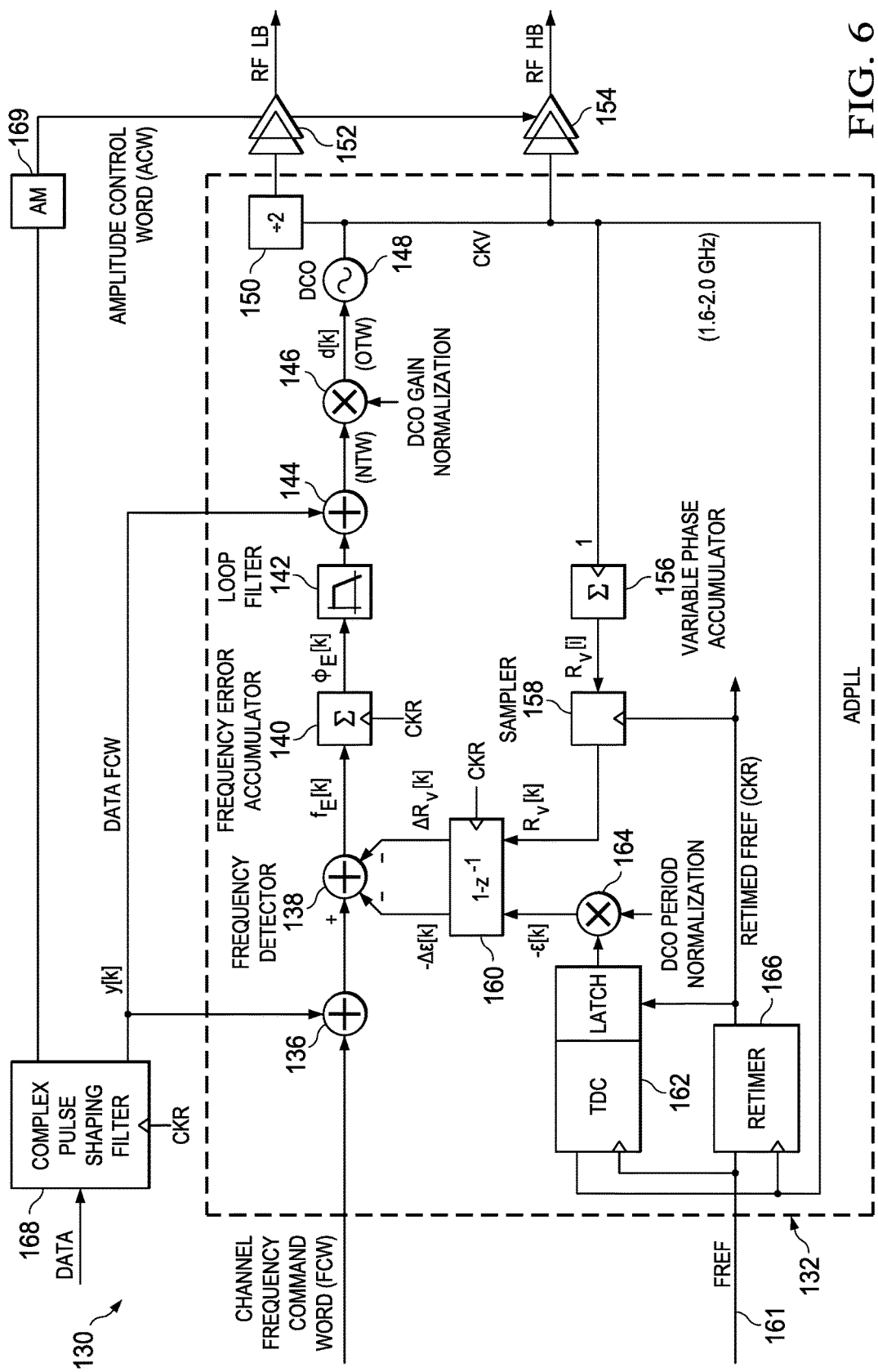
FIG. 6 is a block diagram illustrating functions of an example ADPLL-based polar transmitter suitable for use with the present invention.

A block diagram illustrating an example ADPLL-based polar transmitter for wireless applications is shown in FIG. 6. The example ADPLL shown is used as the basis for a software based ADPLL mechanism described in more detail infra. A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, Staszewski et al., entitled "Hybrid Polar/Cartesian Digital Modulator" and U.S. Pat. No. 6,809,598, to Staszewski et al., entitled "Hybrid Of Predictive And Closed-Loop Phase-Domain Digital PLL Architecture," all of which are incorporated herein by reference in their entirety.

For illustration purposes only, the transmitter, as shown, is adapted for the GSM/EDGE/WCDMA cellular standards. It is appreciated, however, that one skilled in the communication arts can adapt the transmitter illustrated herein to other modulations and communication standards as well without departing from the spirit and scope of the present invention.

The transmitter, generally referenced 130, is well-suited for a deep-submicron CMOS implementation. The transmitter comprises a complex pulse shaping filter 168, amplitude modulation (AM) block 169 and ADPLL 132. The circuit 130 is operative to perform complex modulation in the polar domain in addition to the generation of the local oscillator (LO) signal for the receiver. All clocks in the system are derived directly from this source. Note that the transmitter is constructed using digital techniques that exploit the high speed and high density of the advanced CMOS, while avoiding problems related to voltage headroom. The ADPLL circuit replaces a conventional RF synthesizer architecture (based on a voltage-controlled oscillator (VCO) and a phase/frequency detector and charge-pump combination), with a digitally controlled oscillator (DCO) 148 and a time-to-digital converter (TDC) 162. All inputs and outputs are digital and some even at multi-GHz frequency.

The core of the ADPLL is a digitally controlled oscillator (DCO) 148 adapted to generate the RF oscillator clock CKV. The oscillator core (not shown) operates at a multiple of the 1.6-2.0 GHz (e.g., 4) high band frequency or at a multiple of the 0.8-1.0 GHz low band frequency (e.g., 8). Note that typically, the multiple is a power-of-two but any other suitable integer or even fractional frequency relationship may be advantageous. The output of the DCO is then divided for precise generation of RX quadrature signals, and for use as the transmitter's carrier frequency. The single DCO is shared between transmitter and receiver and is used for both the high frequency bands (HB) and the low frequency bands (LB). In addition to the integer control of the DCO, at least 3-bits of the minimal varactor size used are dedicated for $\Sigma\Delta$ dithering in order to improve frequency resolution. The DCO comprises a plurality of varactor banks, which may be realized as n-poly/n-well inversion type MOS capacitor (MOSCAP) devices or Metal Insulator Metal (MIM) devices that operate in the flat regions of their C-V curves to assist digital control. The output of the DCO is a modulated digital signal at $f_{RF}$. This signal is input to the pre-power amplifier (PPA) 152. It is also input to the RF low band pre-power amplifier 154 after divide by two via divider 150.

The expected variable frequency $f_V$ is related to the reference frequency $f_R$ by the frequency command word (FCW).

$$FCW[k] \equiv \frac{E(f_V[k])}{f_R} \qquad (1)$$

The FCW is time variant and is allowed to change with every cycle $T_R=1/f_R$ of the frequency reference clock. With $W_F=24$ the word length of the fractional part of FCW, the ADPLL provides fine frequency control with 1.5 Hz accuracy, according to:

$$\Delta f_{res} = \frac{f_R}{2^{W_F}} \qquad (2)$$

The number of integer bits $W_I=8$ has been chosen to fully cover the GSM/EDGE and partial WCDMA band frequency range of $f_V=1,600$-$2,000$ MHz with an arbitrary reference frequency $f_R \geq 8$ MHz.

The ADPLL operates in a digitally-synchronous fixed-point phase domain as follows: The variable phase accumulator 156 determines the variable phase $R_V[i]$ by counting the number of rising clock transitions of the DCO oscillator clock CKV as expressed below.

$$R_V[i] = \sum_{l=0}^{i} 1 \qquad (3)$$

The index i indicates the DCO edge activity. The variable phase $R_V[i]$ is sampled via sampler 158 to yield sampled FREF variable phase $R_V[k]$, where k is the index of the FREF edge activity. The sampled FREF variable phase $R_V[k]$ is fixed-point concatenated with the normalized time-to-digital converter (TDC) 162 output $\varepsilon[k]$. The TDC measures and quantizes the time differences between the frequency reference FREF and the DCO clock edges. The sampled differentiated (via block 160) variable phase is subtracted from the frequency command word (FCW) by the digital frequency detector 138. The frequency error $f_E[k]$ samples $$f_E[k] = FCW - [(R_V[k] - \varepsilon[k]) - (R_V[k-1] - \varepsilon[k-1])] \qquad (4)$$

are accumulated via the frequency error accumulator 140 to create the phase error $\phi_E[k]$ samples $$\phi_E[k] = \sum_{l=0}^{k} f_E[k] \qquad (5)$$

which are then filtered by a fourth order IIR loop filter 142 and scaled by a proportional loop attenuator α. A parallel feed with coefficient ρ adds an integrated term to create type-II loop characteristics which suppress the DCO flicker noise.

The IIR filter is a cascade of four single stage filters, each satisfying the following equation:

$$y[k] = (1-\lambda) \cdot y[k-1] + \lambda \cdot x[k] \qquad (6)$$

wherein
x[k] is the current input;
y[k] is the current output;
k is the time index;
λ is the configurable coefficient;

The 4-pole IIR loop filter attenuates the reference and TDC quantization noise with an 80 dB/dec slope, primarily to meet the GSM/EDGE spectral mask requirements at 400 kHz offset. The filtered and scaled phase error samples are then multiplied by the DCO gain $K_{DCO}$ normalization factor $f_R/\hat{K}_{DCO}$ via multiplier 146, where $f_R$ is the reference frequency and $\hat{K}_{DCO}$ is the DCO gain estimate, to make the loop characteristics and modulation independent from $K_{DCO}$. The modulating data is injected into two points of the ADPLL for direct frequency modulation, via adders 136 and 144. A hitless gear-shifting mechanism for the dynamic loop bandwidth control serves to reduce the settling time. It changes the loop attenuator α several times during the frequency locking while adding the $(\alpha_1/\alpha_2-1)\phi_1$ dc offset to the phase error, where indices 1 and 2 denote before and after the event, respectively. Note that $\phi_1=\phi_2$, since the phase is to be continuous.

The frequency reference FREF is input to the retimer 166 and provides the clock for the TDC 162. The FREF input is resampled by the RF oscillator clock CKV via retimer block 166 which may comprise a flip flop or register clocked by the reference frequency FREF. The resulting retimed clock (CKR) is distributed and used throughout the system. This ensures that the massive digital logic is clocked after the quiet interval of the phase error detection by the TDC. Note that in the example embodiment described herein, the ADPLL is a discrete-time sampled system implemented with all digital components connected with all digital signals.

Software Based ADPLL Architecture

Figure 7:
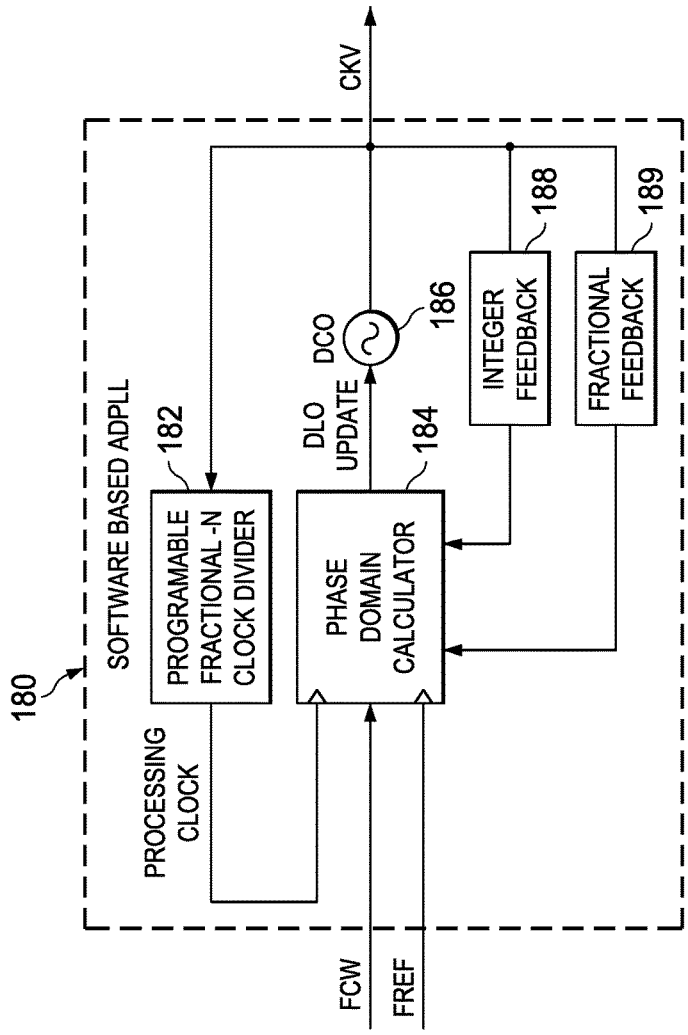
FIG. 7 is a simplified block diagram illustrating an embodiment of the software based ADPLL incorporating a processor based phase domain calculator.

A simplified block diagram illustrating an embodiment of the software based ADPLL incorporating a processor based phase domain calculator is shown in FIG. 7. The ADPLL circuit, generally referenced 180, comprises a phase domain calculator 184, DCO 186, integer feedback block 188, fractional feedback block 189 and programmable fractional-N clock divider 182.

In operation, the phase domain calculator replaces the conventional ADPLL circuit with a software based ADPLL. As with the conventional ADPLL, it is operative to generate the DLO update that is input to the DCO 186 which in turn generates the RF output frequency clock CKV. The phase domain calculator receives the FCW commands, variable phase information (i.e. integer and fractional feedback) and the reference frequency clock FREF, which typically ranges between 13 and 52 MHz. The processing clock output of the programmable clock divider 182 runs at a frequency significantly higher than FREF, such as in the range 200 to 600 MHz, for example.

In accordance with the invention, the phase domain calculator performs the ADPLL operations serially rather than in parallel. In order the complete the ADPLL computation within reference clock cycle, the much faster processor clock is used to clock the phase domain calculator internal circuitry.

The solution uses a reconfigurable computational unit (RCU) or ALU (described infra) that is time shared for most or all computations within the ADPLL. The RCU and its related configuration control logic (constituting a special purpose microcomputer) replaces the dedicated and distributed random logic within a conventional ADPLL. The RCU is controlled via microcode stored in on-chip memory such as random access memory (RAM), read only memory (ROM), Flash memory, etc. Since the computational unit is time shared among most operations, it is operated at a much higher clock rate than the conventional ADPLL which performs all calculations in parallel using dedicated hardware circuits. The RCU circuitry is optimized to perform all the required ADPLL atomic computations within one reference clock cycle.

A block diagram illustrating an example embodiment of the phase domain calculator of the present invention in more detail is shown in FIG. 8. The phase domain calculator, generally referenced 190, comprises an ALU (or RCU) 202, instruction and data memory 192, register file 194, sequencer 196, latches 208, 206, multiplexers 209, 198, 200, 204.

The instructions for implementing the ADPLL operation are stored in the instruction memory. Instructions are input to the sequencer which performs the instruction decoding and generates the appropriate signals to execute each instruction. The register file stores intermediate values calculated by the ALU.

Figure 9:
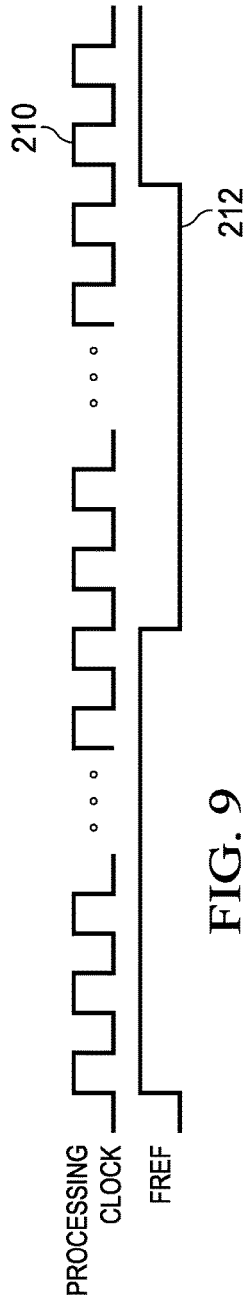
FIG. 9 is a timing diagram illustrating the processing clock and reference frequency timing.

A timing diagram illustrating the processing clock and reference frequency timing is shown in FIG. 9. As shown, the processing clock 210, used to clock the memory, sequencer and register file, is at a significantly higher clock rate than the reference clock FREF 212. This is required in order the complete an operation cycle of the ADPLL within a single reference clock period.

Figure 10:
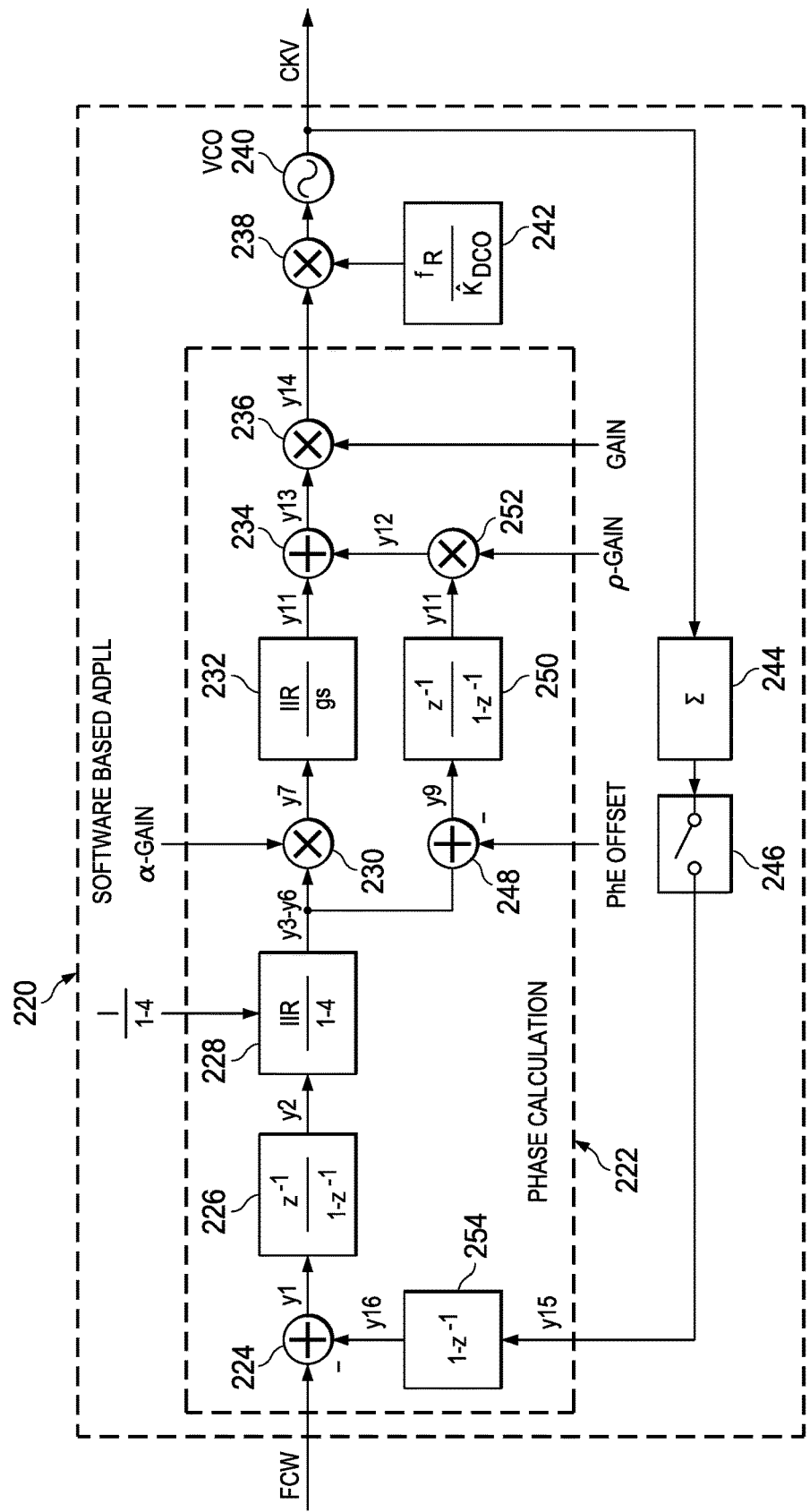
FIG. 10 is a block diagram illustrating an instruction view of the software based ADPLL architecture of the present invention.

A block diagram illustrating an instruction view of the software based ADPLL architecture of the present invention is shown in FIG. 10. The circuit, generally referenced 220, comprises a phase calculation unit 222, gain normalization 238, DCO 240, gain calibration 242, accumulator 244 and variable phase sampler 246. The phase calculation unit shows an instruction view of the ADPLL architecture performed in software. In particular, the phase calculation unit 222 comprises a phase detector 224, frequency error accumulator 226, IIR loop filter 228, a proportional gain multiplier 230, IIR filter 232, adder 234, integral gain multiplier 236, offset phase error adder 248, phase error accumulator 250 and integral or p gain multiplier 252. Both proportional and integral multipliers preferably use power-of-two arithmetic so that their respective multipliers could be implemented as bit-shift operators. For non-power-of-two arithmetic, full multipliers can be used with the consequent increase in circuit cost and complexity.

The ADPLL circuit shown is an ADPLL architecture that is commonly used in wireless applications for RF frequency generation. In this digital architecture, the traditional VCO is replaced with a digitally controlled oscillator (DCO) and the oscillating frequency of the DCO is controlled by a frequency command word (FCW) instead of the reference clock, as described in detail supra. The phase detecting and filtering parts are all digital with intensive digital signal processing involved as highlighted.

In operation, the ADPLL operation is partitioned into a plurality of atomic operations, wherein each atomic operation performs a complete processing step within the ADPLL. For example, an adding operation representing adder 224 comprises one atomic operation. Similarly, accumulation block 226 and each of four elemental first-order IIR operations in IIR filter block 228 also comprise a single atomic operation each. Each atomic operation is performed by a separate instruction. Individual instructions are provided for each atomic operation in the ADPLL (or any other task).

The computation elements within the phase calculation block 222 are the elements implemented and executed as software instructions. The computations within block 222 can be expressed as pseudo code as shown in the following Listing 1.

---

Listing 1: Sequential pseudo-code for ADPLL phase computation

| | |
|---|---|
| L1: y16 = y15 − S1 | // S1 is the store element |
| S1 = y15 | // delay |
| y1 = FCW − y16 | |
| y2 = y2 + y1 | // accumulation |
| y3 = IIR (a1, y2, y3) | // 4th order infinite impulse response(IIR) filter |
| y4 = IIR (a2, y3, y4) | |
| y5 = IIR (a3, y4, y5) | |
| y6 = IIR (a4, y5, y6) | |
| y7 = SHL (y6, alpha) | // shift operation |
| y11 = IIR (gs, y7, y11) | |
| y9 = y6 − PhE | |
| y10 = y10 + y9 | // implies accumulation |
| y12 = SHL (y10, rho) | |
| y13 = y11 + y12 | |
| y14 = y13 * gain | |
| jump L1 | // operates in a continuous loop |

---

As described supra, in prior art ADPLL circuits, all ADPLL phase computations are implemented using dedicated hardware (i.e. a hardwired design), which limits the ability to adjust the ADPLL algorithm. In accordance with the software based architecture of the present invention, these ADPLL functions are integrated within a processor using shared hardware thereby providing significant flexibility to the ADPLL algorithm.

Processor Based ADPLL Architecture

Figure 11:
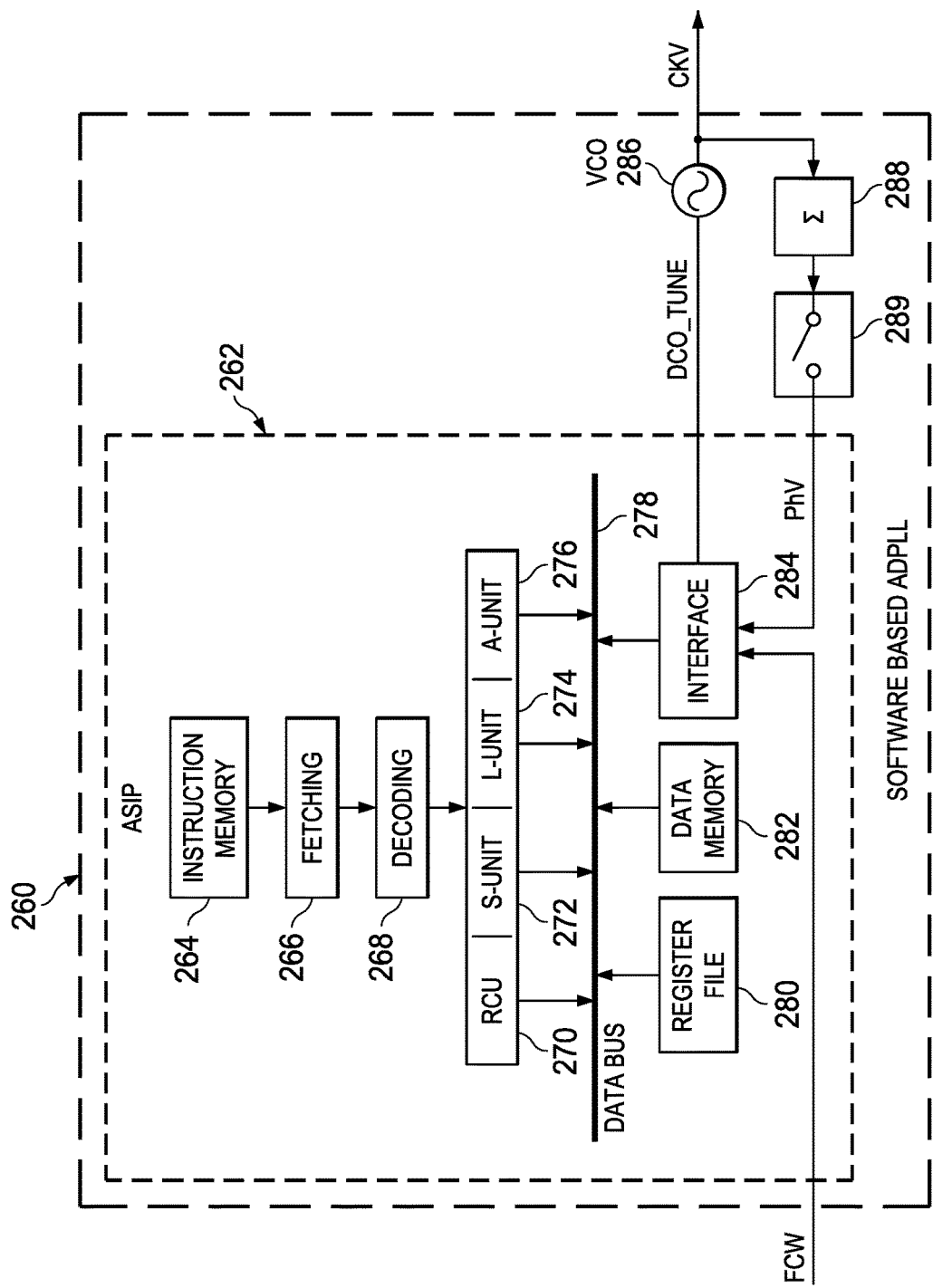
FIG. 11 is a block diagram illustrating an example processor based software ADPLL architecture of the present invention.

A block diagram illustrating an example processor based software ADPLL architecture of the present invention is shown in FIG. 11. The ADPLL circuit, generally referenced 260, comprises an application specific instruction-set processor (ASIP) 262, DCO 286, accumulator 288 and variable phase sampler 289. The ASIP 262 comprises instruction memory 264, fetch block 266, decode block 268, data bus 278, RCU 270, S-unit 272, L-unit 274, A-unit 276, register file 280, data memory 282 and interface 284.

All ADPLL computations as delineated in Listing 1 above are incorporated into a so-called Application Specific Instruction-set Processor (ASIP) 262. It is appreciated that a general purpose processor may also be used to perform the ADPLL operation. An ASIP, however, is far more efficient due to the instruction set being adapted to perform a small but dedicated set of atomic operations.

In operation, the ASIP processor stores the ADPLL software instructions in the instruction memory 264. The instructions are then fetched from the instruction memory via fetch block 266 and fed into the decoding block 268. All required control signals are generated through the decoding block to control the operation of the various computational units, including the A-Unit 276 for performing arithmetic operations, e.g., addition, subtraction, etc., L-Unit 274 for performing logic operations, e.g., AND, OR, XOR, etc. and S-Unit 272 for performing data storage and movement operations. A reconfigurable calculation unit (RCU) 270 is constructed to provide application specific instructions for the ADPLL. The RCU, for example, is operative to implement the 1-stage IIR filtering operation within a single instruction. It is noted that the application driven customized instruction set is what differentiates an ASIP from a general purpose processor which performs ADPLL computations much less efficiently to the extent that it may not even be able to complete the necessary computations within the reference clock period.

The ASIP processor is operative to read the FCW and variable phase (PhV) inputs, sequentially perform all the computations (i.e. atomic operations) required for the ADPLL as presented in Listing 1 within one system reference clock cycle and send the resulting tuning word DCO_TUNE (i.e. DLO update) to the DCO which in turn uses the tuning word to adjust its output frequency. It is important to note that all the computations are performed via the programmed software stored in instruction memory of the ASIP. Note also that the majority of the computations are performed by the RCU, which is designed specifically to implement the atomic operations of the targeted ADPLL application.

Reconfigurable Calculation Unit (RCU)

The structure of the RCU will now be described in more detail. As described above, all the computations in Listing 1 are described in terms of atomic arithmetic operations, such as additions, subtractions, shifting, multiplications, etc. and as more complicated operations, such as IIR filtering. A prior art hardwired implementation simply instantiates the number of hardware operators equal to the number of atomic operations required by the ADPLL algorithm. This, however, has its drawbacks as discussed supra.

The ASIP based design of the present invention utilizes one or more reconfigurable computational units that are used to perform all arithmetic operations implementing the ADPLL algorithm. This computational unit is "recycled" sequentially among all the arithmetic operations within a single cycle of the ADPLL system clock. The internal state of the ADPLL is stored between clock cycles in internal storage elements (i.e. register file, data memory, etc.). An important aspect of the RCU design is the greatly increased application efficiency along with a maximization of resource reuse.

Detailed knowledge of the task to be implemented (e.g., ADPLL algorithm) is important in creating the functionality of the computational unit in order to optimize its complexity and system throughput requirements. In the case of an ADPLL algorithm, all the elemental ADPLL computations (except for IIR filtering) are either add/subtract or power-of-two multiply operation. Therefore, the invention provides for a single IIR computation that has been optimized to be represented as a single operation in the computational unit.

FIGS. 12A, 12B, 12C and 12D illustrate the mapping process and the resulting configuration of the RCU. In particular, FIG. 12A is a diagram illustrating the output and transfer function equations for the infinite impulse response (IIR) filter portion of the ADPLL. FIG. 12B is an equivalent block diagram implementing the output equation shown in FIG. 12A. The circuit, generally referenced 290, comprises multipliers 292, 298, adders 294, 299 and unit delay 296.

FIG. 12C is an equivalent block diagram implementing the output equation shown in FIG. 12A whereby the multiplication operations have been replaced with shift operations. The circuit, generally referenced 300, comprises shift operations 302, 309, adders 304, 308 and unit delay 306. FIG. 12D is a diagram illustrating the resultant reconfigurable calculation unit (RCU) implementing the output equation shown in FIG. 12A. The RCU, generally referenced 310, comprises shifter 312, 318 and adders 314, 316. The unit delay element is replaced with data lines Rb and Rd for reading and writing to an external memory such as the register file or data memory.

Figure 13:
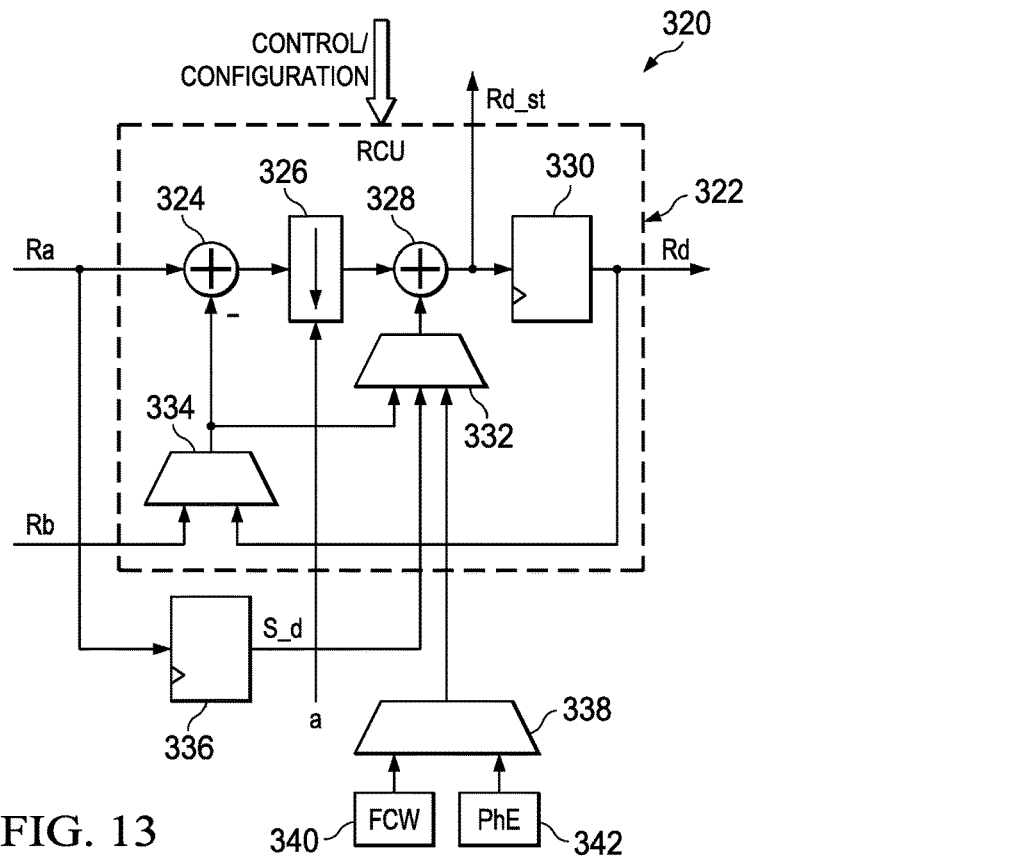
FIG. 13 is a block diagram illustrating an example RCU unit for implementing the ADPLL circuit.

Thus, for application to an ADPLL, the multiplication operation in the IIR filter is simplified with a shifting operation. The final RCU in 12D is a pure computation unit without any storage element. To map the IIR equation below $$y_k = (1-a) \cdot y_{k-1} + a \cdot x_k \quad (7)$$

to the RCU unit, the following applies:
$x_k$ maps to RCU input Ra;
$y_{k-1}$ maps to RCU input Rb;
$y_k$ maps to RCU output Rd;

The RCU unit is made further configurable to accommodate all the main computations for the ADPLL in an efficient manner. A block diagram illustrating an example RCU unit for implementing the ADPLL circuit way is shown in FIG. 13. The RCU and related circuitry, generally referenced 320, comprises a plurality of elements as follows: two data inputs (Ra Rb), two data outputs (Rd_st, Rd), three atomic computation units (first addition/subtraction 324, shifter 326, second addition/subtraction 328), two latch/storage elements (input latch S_d 336 and output latch Rd 330), local registers for data storage, e.g., shift amount a, FCW 340, PhE 342, multiplexers for data steering 332, 334 and control/configure signals.

In operation, the RCU takes input data Ra and goes through the first addition/subtraction followed by a shifting operation followed by a second addition/subtraction. The data is then sent to the outside register file Rd_st or latched (Rd) for the next computation. An input latching element (S_d) is included as part of a differentiation operation. All the computation units including the data paths inside the RCU are configurable with the control/configure signals generated by the ASIP decoding block.

Table 1 below shows the mapping of the customized instruction set provided by the RCU and their corresponding targeted computations in the ADPLL.

TABLE 1

Customized instructions and their
corresponding computations in the ADPLL

| Computations in ADPLL | Customized Instructions |
|---|---|
| L1: y16 = y15 − S_d | F_Diff (y15, y16) |
| S_d = y15 | |
| y1 = FCW − y16 | F_PheAcc (y1, y2) |
| y2 = y2 + y1 | |
| y3 = IIR (a1, y2, y3) | F_IIR1 (y2, y3) |
| y4 = IIR (a2, y3, y4) | F_IIR2 (y3, y4) |
| y5 = IIR (a3, y4, y5) | F_IIR3 (y4, y5) |
| y6 = IIR (a4, y5, y6) | F_IIR4 (y5, y6) |
| y7 = SHR (y6, alpha) | F_SHR (y6, y7) |
| y11 = IIR (gs, y7, y11) | F_IIRgs (y7, y11) |
| y9 = y6 − PhE | F_IntAcc (y6, y10) |
| y10 = y10 + y9 | |
| y12 = SHR (y10, rho) | F_SHRAdd (y10, y11, y13) |
| y13 = y11 + y12 | |
| y14 = y13 * gain | F_Gain( ) |
| jump L1 | NA |

Detailed descriptions for most of the instructions in Table 1 above are provided below. For each instruction, a corresponding figure is provided illustrating the data paths and computation elements in the RCU used in executing the instruction. Elements in each of the figures described below operate as described above in connection with FIG. 13. Further, the bold lines or arrows in each figure highlight the data path for that particular instruction.

F_Diff Instruction
F_Diff(y15, y16): y16=y15−S_d
S_d=y15

Figure 14:
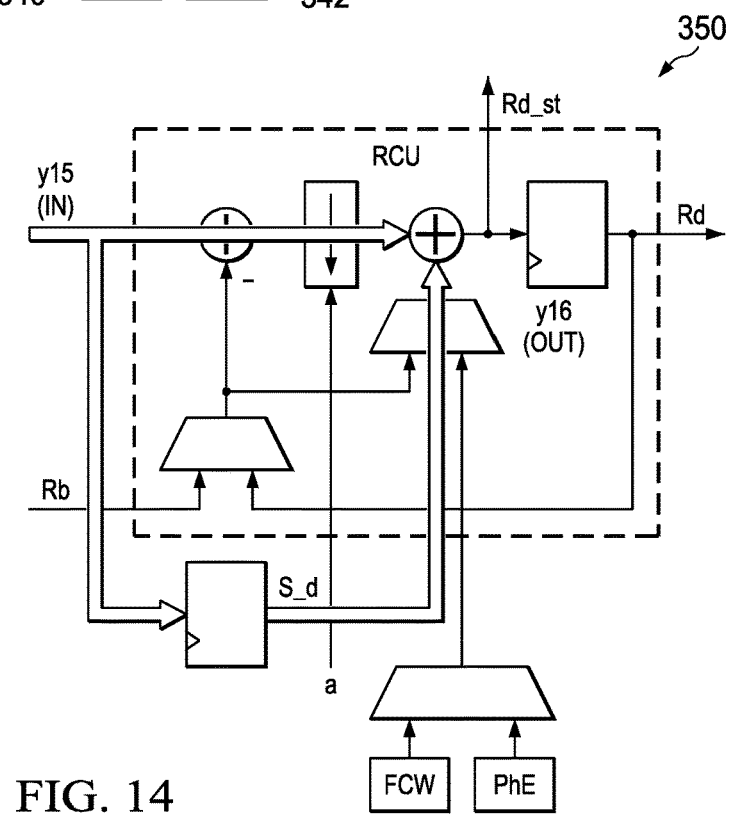
FIG. 14 is a block diagram illustrating the RCU unit for implementing the F_Diff( ) instruction.

A block diagram illustrating the RCU unit 350 for implementing the F_Diff( ) instruction is shown in FIG. 14. The F_Diff instruction implements a differentiation operation. The bold arrow lines highlight the data path in the RCU. Input y15 is received and the first addition/subtraction unit is bypassed (e.g., the second or negating input to the first adder is set to zero). The shifting unit is also bypassed and a subtraction (via the second addition/subtraction unit) is performed with local register S_d. The result y16 is output via Rd_st. The instruction also updates S_d with input y15 via register latch S_d.

Figure 15:
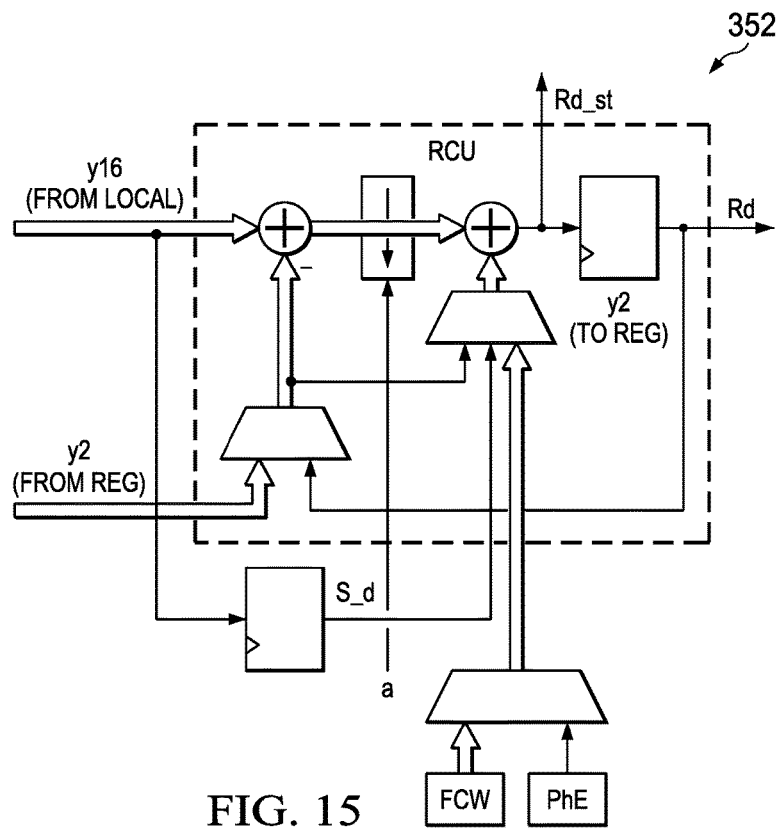
FIG. 15 is a block diagram illustrating the RCU unit for implementing the F_PheAcc( ) instruction.

F_PheAcc Instruction
F_PheAcc(y16, y2): y1=FCW−y16
y2=y2+y1;

A block diagram illustrating the RCU unit 352 for implementing the F_PheAcc( ) instruction is shown in FIG. 15. This instruction implements a subtraction plus an accumulation operation. It takes the input y16, performs the accumulation operation using the first addition/subtraction unit, bypasses any shifting (i.e. the shifter is configured for pass through operation). A subtraction operation with local register FCW is then performed. The accumulation is done on the Rd register latch.

F_IIR Instruction

F_IIR( ): Rd=Rb>>(1−a)+Ra>>a

Figure 16:
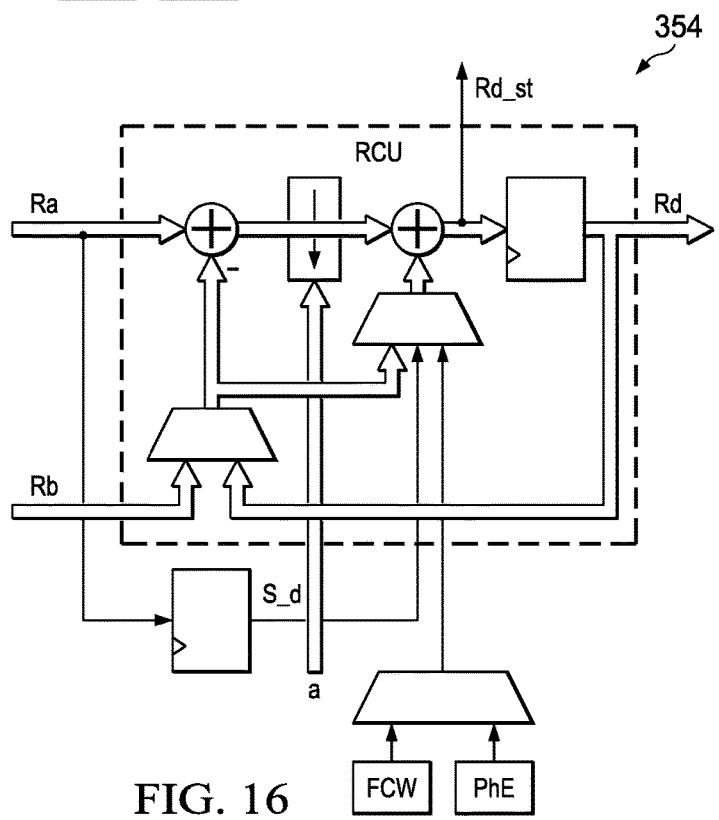
FIG. 16 is a block diagram illustrating the RCU unit for implementing the F_IIR( ) instruction.

A block diagram illustrating the RCU unit 354 for implementing the F_IIR( ) instruction is shown in FIG. 16. This instruction implements an IIR filtering operation. The shift amount 'a' is pre-set locally within the RCU. Thus, the RCU is optimized to have the capability of performing an IIR filter operation in a single instruction cycle. This permits an efficient computation of the atomic operations needed to implement the ADPLL within a single reference clock period.

F_SHR Instruction

F_SHR(Ra, Rd): Rd=Ra>>a

Figure 17:
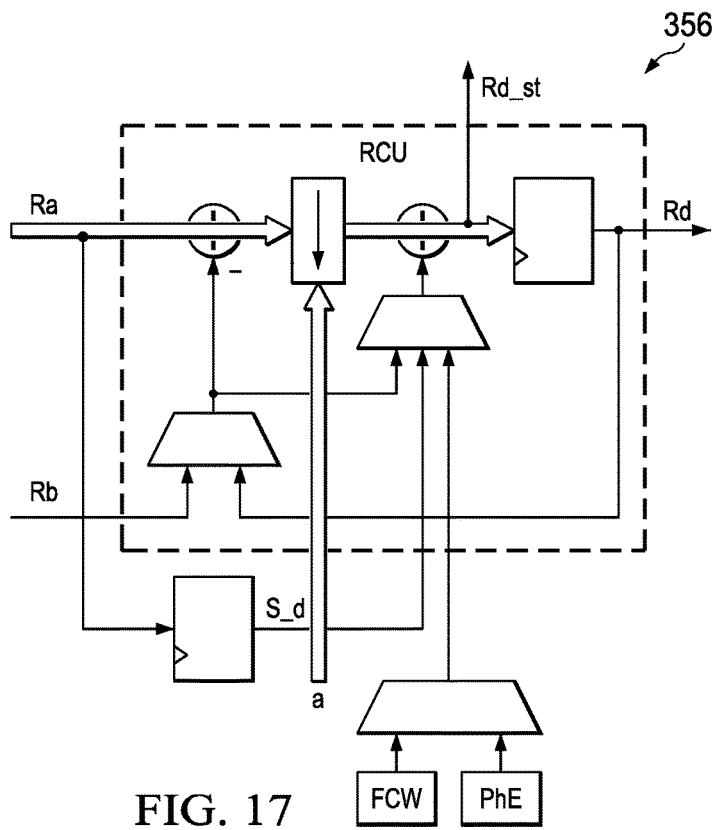
FIG. 17 is a block diagram illustrating the RCU unit for implementing the F_SHR( ) instruction.

A block diagram illustrating the RCU unit 356 for implementing the F_SHR( ) instruction is shown in FIG. 17. This instruction implements a shifting operation. The shift amount 'a' is pre-set locally within the RCU. The two addition/subtraction units are bypassed for this instruction.

F_IntAcc Instruction

F_IntAcc(y6, y10): y9=y6−PhE
y10=y10+y9

Figure 18:
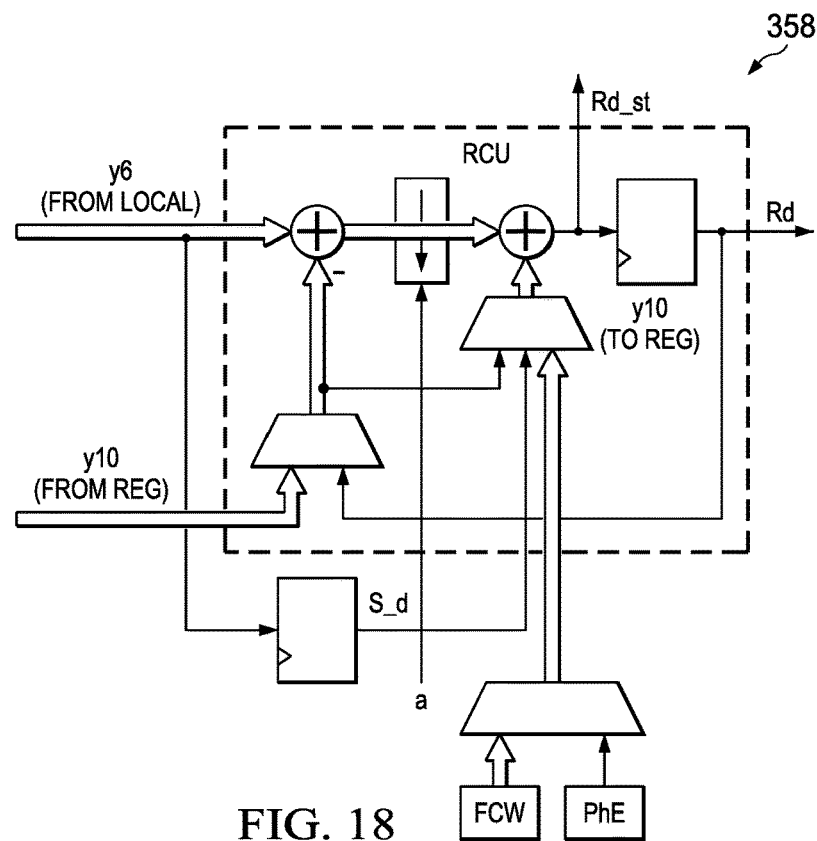
FIG. 18 is a block diagram illustrating the RCU unit for implementing the F_IntAcc( ) instruction.

A block diagram illustrating the RCU unit 358 for implementing the F_IntAcc( ) instruction is shown in FIG. 18. This instruction implements a subtraction and an accumulation operation. It takes the input y16, performs an accumulation in the first addition/subtraction unit and then bypasses the shifter. A subtraction is then performed using local register PhE.

F_SHRAdd Instruction

F_SHRAdd(y10, y11, y13): y12=SHR (y10, rho)
y13=y11+y12

Figure 19:
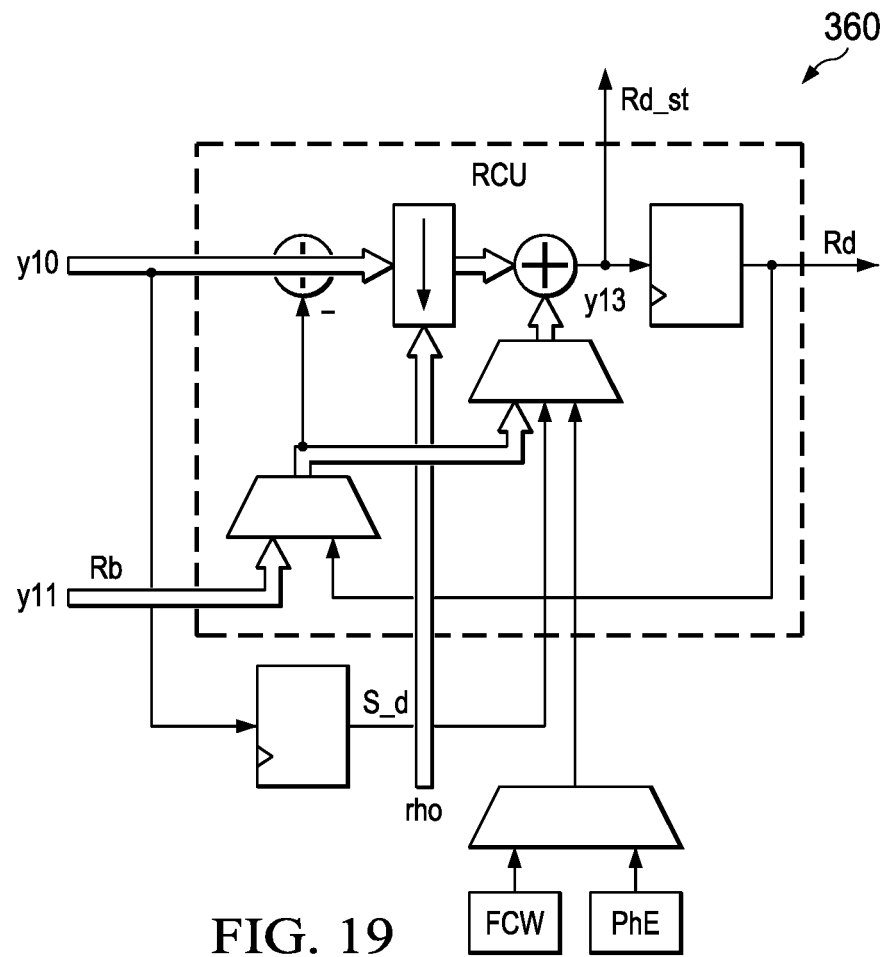
FIG. 19 is a block diagram illustrating the RCU unit for implementing the F_SHRAdd( ) instruction.

A block diagram illustrating the RCU unit 360 for implementing the F_SHRAdd( ) instruction is shown in FIG. 19. This instruction implements a shifting operation followed by an addition operation. The shift amount RHO is set locally in the RCU. Input y10 is received, the first addition/subtraction unit is bypassed and then a shifting operation is performed. The shifter output then undergoes an addition operation via the second addition/subtraction unit.

F_Gain Instruction

The F_Gain( ) instruction performs a multiplication by a gain value. In the case where the gain value is a power of two, the shift operation is used to perform this instruction. For non power of two gain values, a multiplier in the RCU is used (not shown).

In addition to the instructions described in detail hereinabove, the RCU comprises other customized instructions that are needed for general purpose applications, such as for setting RCU local register values, etc.

RF Spur Reduction

Figure 20:
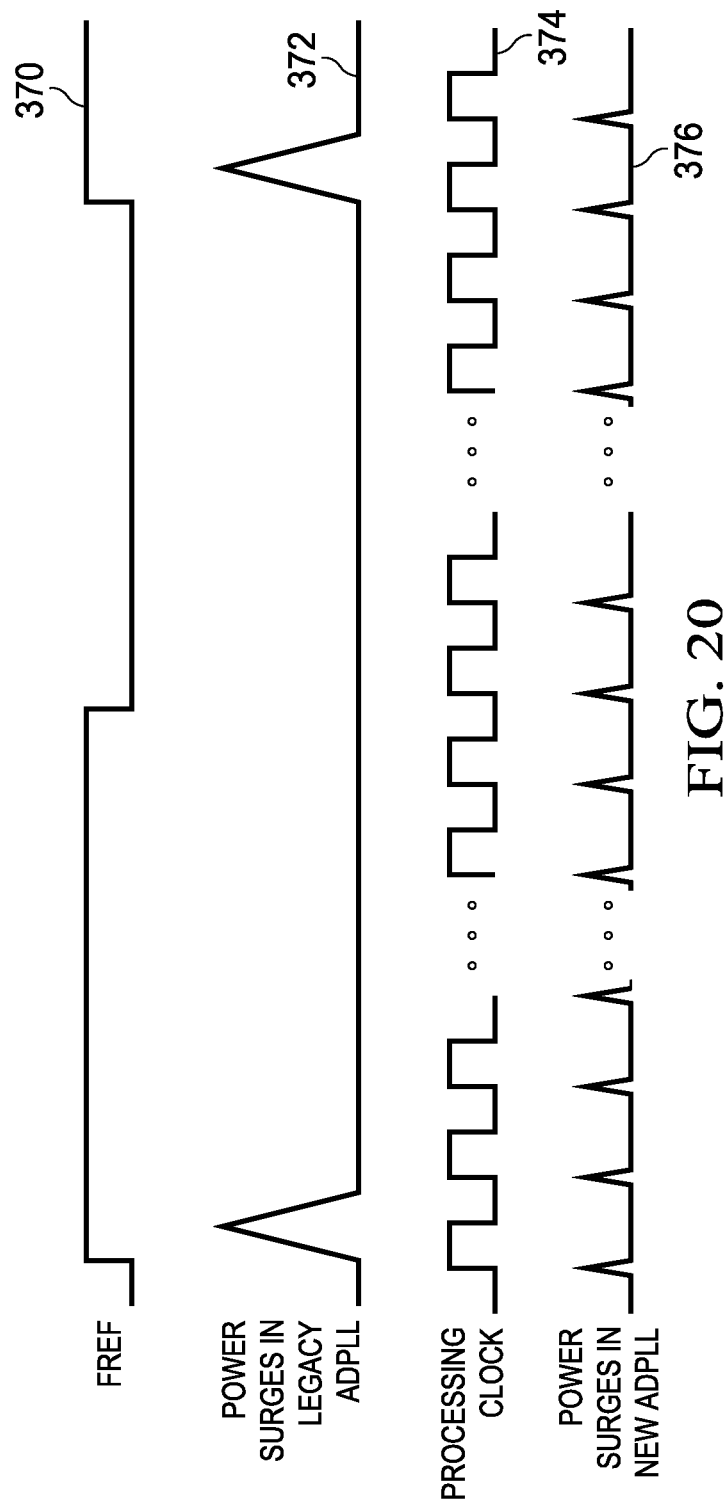
FIG. 20 is a timing diagram illustrating several ADPLL processing clock options and the current spikes resulting therefrom.

The effects of the software based ADPLL on RF spur reduction will now be described. As described supra, in prior art single-chip radios, the phase domain calculation portion of the ADPLL signal processing is traditionally implemented using dedicated random logic gates. In such an implementation, all computations are initiated on a rising edge of the ADPLL system clock and latched on the subsequent rising edge of the clock. This is shown in FIG. 20 which illustrates a timing diagram of several ADPLL processing clock options and the current spikes resulting therefrom. Trace 370 is the FREF system reference clock while trace 374 represents the processor clock.

Since the majority of circuit switching activity in the PLL (and also other close-in circuitry) is centered on a rising edge of the FREF system clock, most of the digital current is being switched at this edge as well, as indicated by trace 372. These digital current surges find their way into on-chip DCO and PA circuit nodes in the transmitter and LNA and mixer nodes in the receiver via various parasitic coupling mechanisms. The current rush energy due to digital processing at the system clock rate gets upconverted into the RF spectrum by the DCO, resulting in unacceptable RF spurs that are close in frequency to the carrier. The Federal Communications Commission (FCC) rules and numerous wireless communication standards place very low limits on the energy outside of the information carrying frequency range that is allowed to be radiated from wireless terminals.

Figure 21:
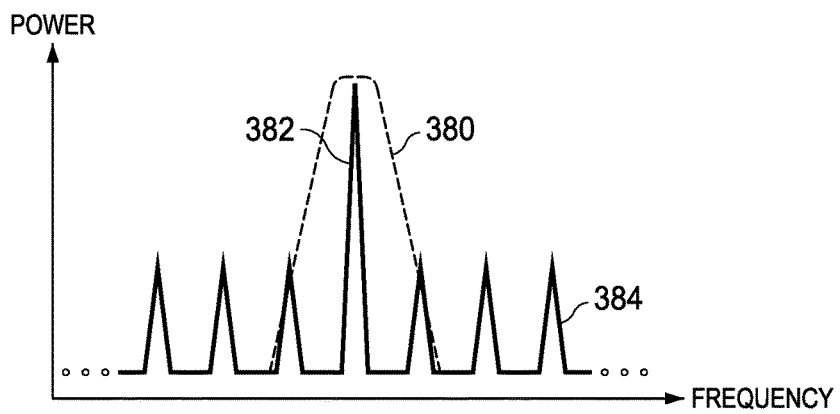
FIG. 21 is a timing diagram illustrating an example RF spectrum generated by a legacy ADPLL.

These low frequency RF spurs are normally very difficult to filter out in a wireless terminal before they are radiated by the antenna because of their proximity in the spectrum to the carrier as shown in FIG. 21. The FREF clock spurs 384 are shown around the carrier 382. The filtering envelope 380 will not sufficiently attenuate the spurs to meet the various wireless standards. This is because a high order filtering is required to block the undesired energy, i.e. a steep filter envelope is required. The typical combined filtering effects of the PA (power amplifier), SAW filter and antenna filter out only a portion of the energy of these undesired RF spurs, thus making FCC rules and wireless standard compliance extremely difficult to meet.

In contrast, the mechanism of the present invention is operative to perform the atomic operations serially at the much faster processor rate. At each processor cycle, only a single instruction is executed resulting in reduced current transients being generated, as indicated in trace 376. This results in significantly reduced RF spur generation. In the present invention, the effects these generated spurs have on RF performance are two-fold: (1) the spurs are shifted to higher frequencies where they are easier to filter out by the oscillator's LC tank, DPA matching network, PA matching network, bandpass filtering in the RF front-end module, as well as overall parasitic RC (resistor-capacitor) network; and (2) the energy of each spur is reduced.

Figure 22:
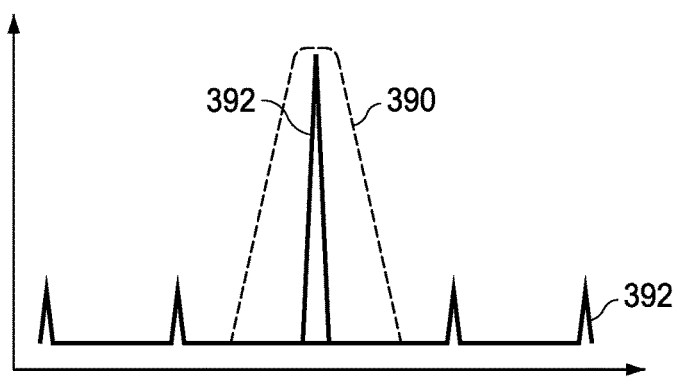
FIG. 22 is a timing diagram illustrating an example RF spectrum generated by the software based ADPLL of the present invention.

In accordance with the invention, the software based ADPLL significantly reduces the generation of RF spurs in sensitive frequency bands of the DRP by changing the frequency plan of the switching logic gates. The ASIP/RCU performs the bulk of computations at the processor clock rate which is much higher in frequency than that of the system reference clock (FREF). This result in the RF spurs being shifted outside the sensitive regions close to the carrier frequency as shown in FIG. 22. The processing clock spurs 392 are now far away from the carrier 392 and the filtering envelope 390 is able to remove these spurs with ease.

It is noted that the total amount of energy consumed in performing computations in the conventional ADPLL and the software based ADPLL of the invention is substantially the same. The frequency content of this energy, however, is significantly different. In case of the conventional ADPLL, the computation energy is concentrated at the reference clock edges and therefore has strong low frequency harmonic.

In case of the software based ADPLL, the computation energy is spread out between the reference clock edges (which may or may not coincide with the processor clock edges). The spreading out of the computation energy over the reference clock period serves to create a much higher frequency harmonic. When these harmonics mix with the carrier, they are offset in frequency around the carrier. The filtering requirements to remove the undesired RF spurs close to the carrier are excessive, as in the case of the conventional ADPLL. The further away from the carrier the RF spurs are located, the more relaxed the filtering requirements become. Changing the frequency content of the computation energy to improve the RF spectrum characteristics is referred to as frequency planning. Such frequency planning also helps to relax circuit design constraints, such as power routing resistance and decoupling capacitance values, which contribute to the magnitude of the energy surges at the clock edges.

Further, the frequency planning can be modified by varying the amount of oversampling (i.e. the ratio of processor clock frequency to the reference frequency FREF). The frequency planning can be lowered as long as the minimum required processing throughput in the processor is maintained. Otherwise, the required atomic operations of the ADPLL may not be completed within a reference clock cycle.

Figure 23:
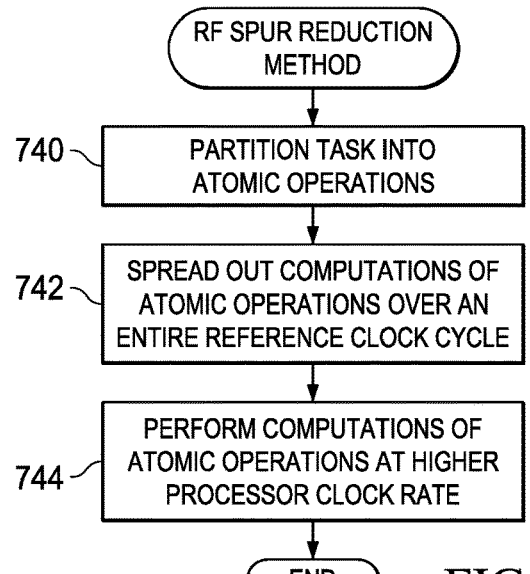
FIG. 23 is a flow diagram illustrating the RF spur reduction method of the present invention.

It is appreciated that the application of the software based mechanism described herein is not limited to an ADPLL. The mechanism can be applied to any computing or processing task that can benefit from reduced spur generation. A flow diagram illustrating the RF spur reduction method of the present invention is shown in FIG. 23. In the general case, the task is first partitioned into a plurality of atomic operations (step 740). The computation of the atomic operations required to complete the task are spread out over an entire reference clock period (step 742). The computation of each atomic operation occurs at the higher processor clock rate, rather that the slower reference clock rate (step 744).

Figure 24:
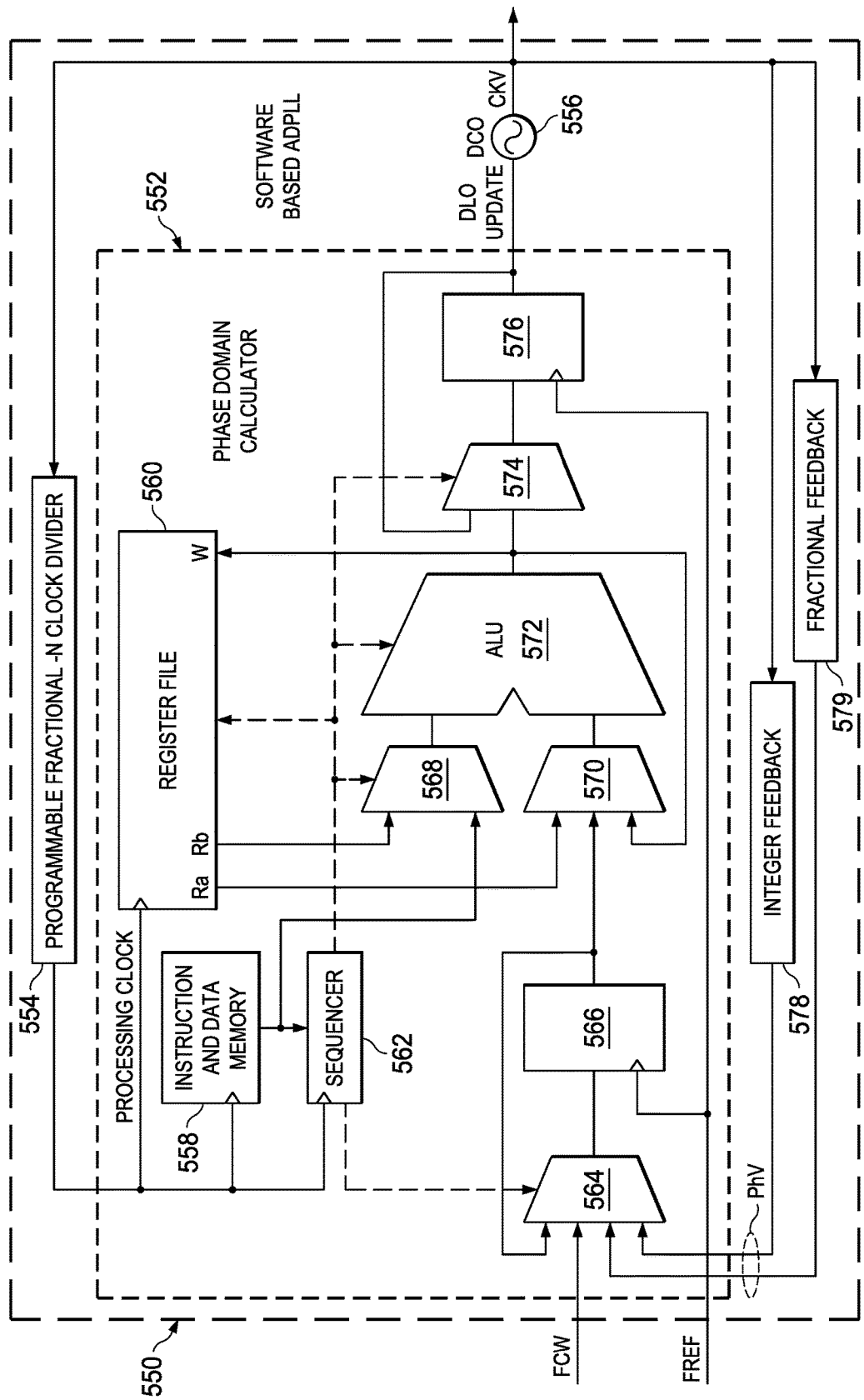
FIG. 24 is a block diagram illustrating an example ASIP based implementation of the software ADPLL of the present invention.

Several embodiments of the processor based mechanism will now be presented. Each is an alternative implementation of the software based ADPLL. A block diagram illustrating an example ASIP based implementation of the software ADPLL of the present invention is shown in FIG. 24. The software based ADPLL, generally referenced 550, comprises a phase domain calculator 552, DCO 556, programmable fractional-N clock divider 554, integer feedback block 578 and fractional feedback block 579. The phase domain calculator 552 comprises an ALU (RCU) 572, instruction and data memory 558, register file 560, sequencer 562, latches 566, 576, multiplexers 564, 568, 570, 574.

Figure 25:
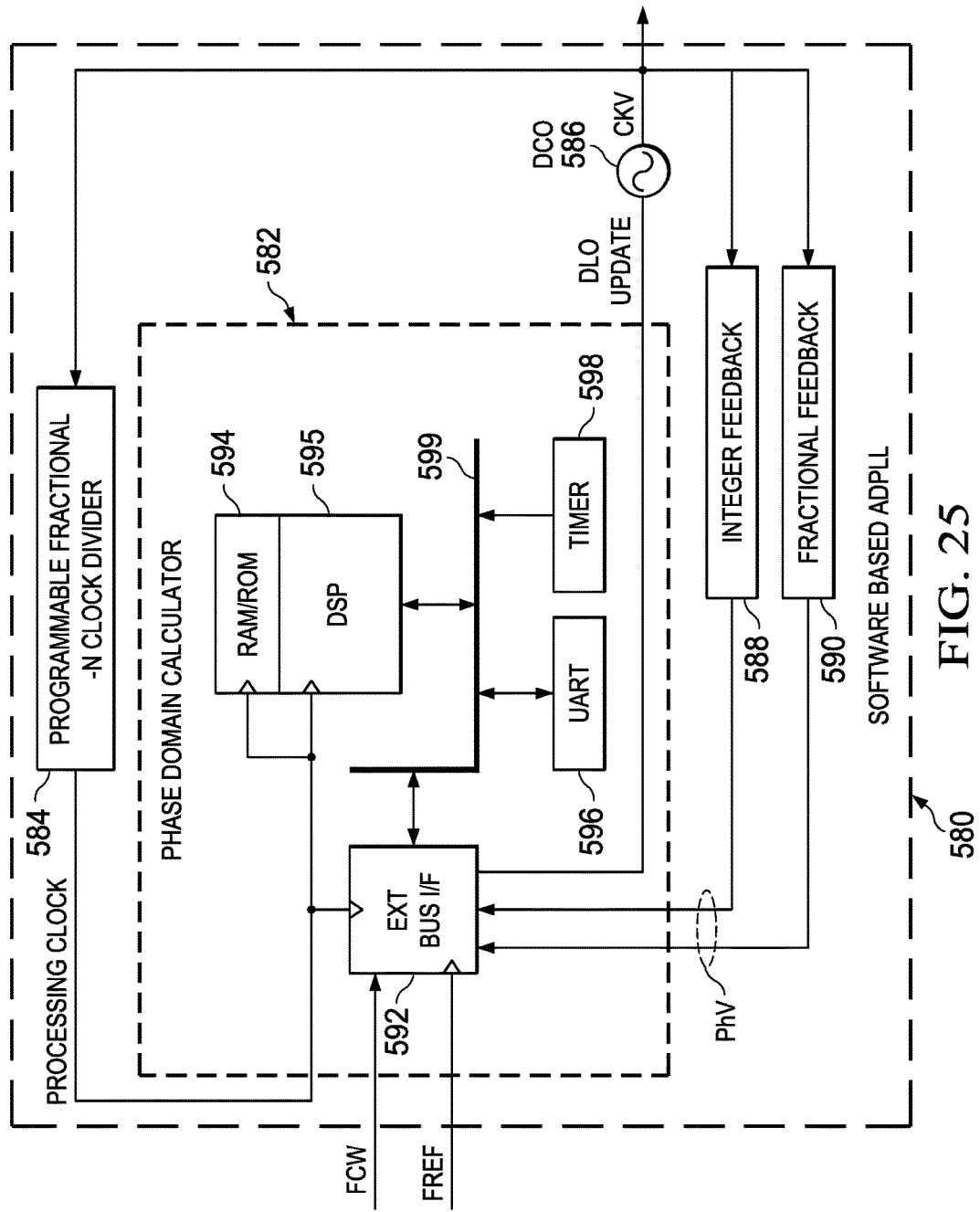
FIG. 25 is a block diagram illustrating an example DSP based implementation of the software ADPLL of the present invention.

A block diagram illustrating an example DSP based implementation of the software ADPLL of the present invention is shown in FIG. 25. The software based ADPLL, generally referenced 580, comprises a phase domain calculator 582, DCO 586, programmable fractional-N clock divider 584, integer feedback block 588 and fractional feedback block 590. The phase domain calculator 582 comprises memory block (RAM/ROM) 594, a DSP core 595, external bus interface (I/F) 592, UART 596 and timer 598.

Figure 26:
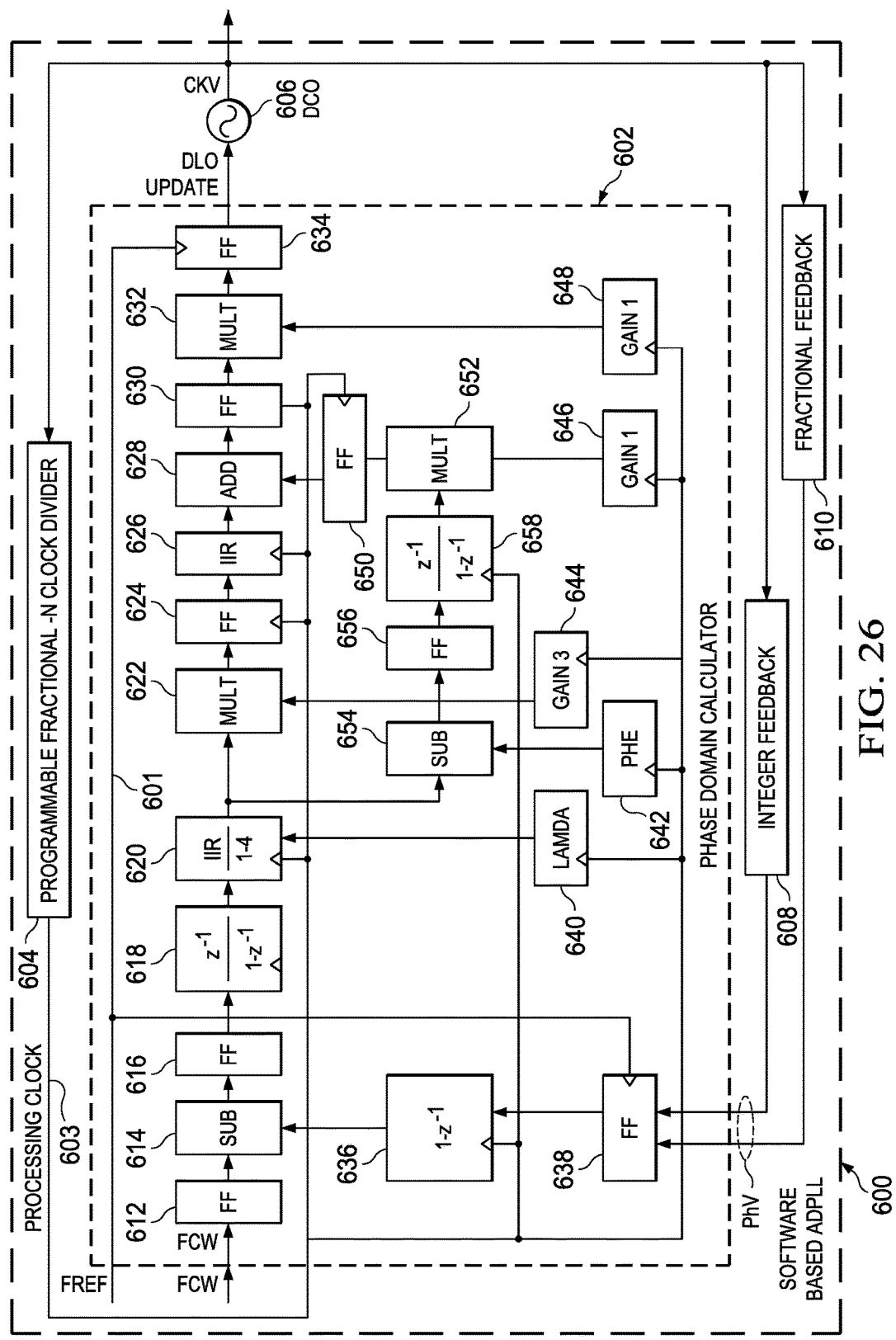
FIG. 26 is a block diagram illustrating an example hardware state machine based implementation of the software ADPLL of the present invention.

A block diagram illustrating an example hardware state machine based implementation of the software ADPLL of the present invention is shown in FIG. 26. The software based ADPLL, generally referenced 600, comprises a phase domain calculator 602, DCO 606, programmable fractional-N clock divider 604, integer feedback block 608 and fractional feedback block 610. The phase domain calculator 602 is similar in construction and operation to the phase calculation 222 (FIG. 10). In particular, the phase domain calculator 602 comprises flip-flops 612, 616, 624, 630, 634, 656, 650, 638, subtractors 614, 654, adder 628, multipliers 622, 632, 652, accumulators 618, 658, differentiator 636, IIR bocks 620, 626, Lamba register 640, PHE offset register 642, Gain1 register 646, Gain2 register 648 and Gain3 register 644.

Figure 27:
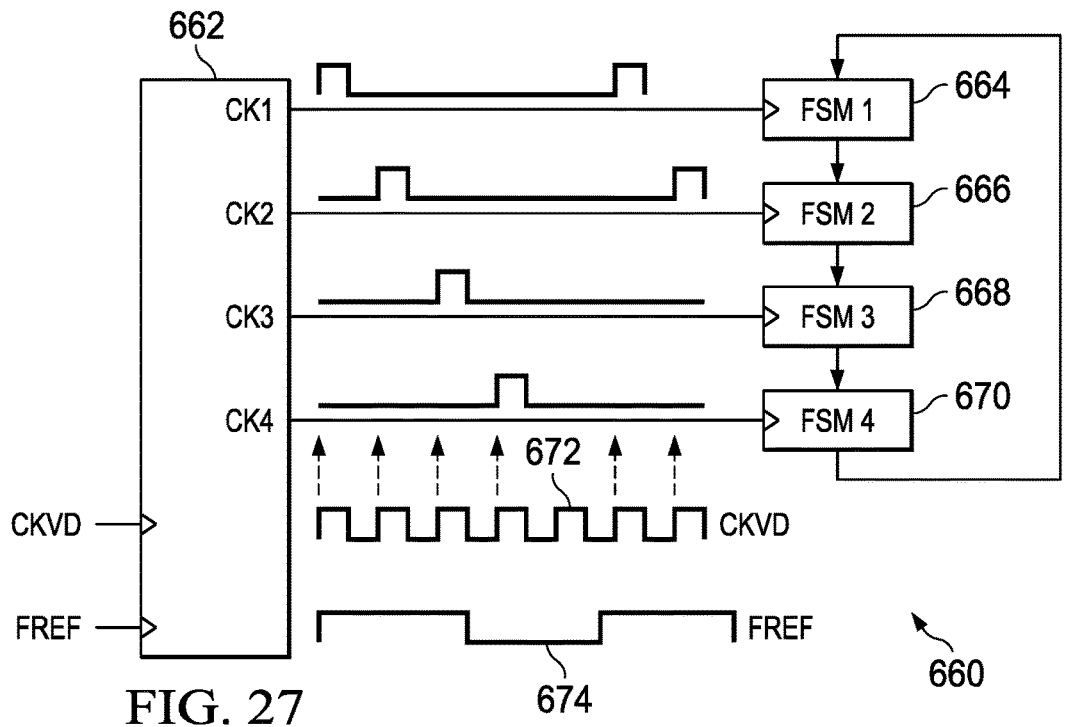
FIG. 27 is a block diagram illustrating a first example implementation of the state machine used to implement the software ADPLL of the present invention.

A block diagram illustrating a first example implementation of the state machine used to implement the software ADPLL of the present invention is shown in FIG. 27. The circuit, generally referenced 660, comprises a clock generator circuit 662 and a plurality of finite state machines (FSMs) 664, 666, 668, 670. The clock generator is operative to generate the clock signals for the functional units, i.e. FSM1, FSM2, FSM3, FSM4. Although only four units are shown for the sake of simplicity, it is appreciated that any number of state machines may be implemented.

The functional units are executed in a sequential manner to provide the desired overall functionality of a subsystem such as a PLL or other circuit/task. An input of a functional unit is connected to the output of the previous unit with the last unit feeding the first unit. Only a simple circular arrangement is shown although the technique is applicable to more complicated arrangements as well, such as forking and merging.

The higher frequency clock CKVD 672 is generated by performing frequency or edge division of the variable clock CKV. The CKVD clock is used to generate internal clocks CK1, CK2, CK3, CK4, each one providing significant edges to its respective functional units FSM1, FSM2, FSM3, FSM4. The frequency of the CKVD clock is chosen so as to guarantee that all the elementary functional operations performed by functional units FSM1, FSM2, FSM3, FSM4 are executed within a single reference clock FREF cycle 674. This is accomplished by requiring the CKVD clock to be (in this example) at least four times faster (i.e. the number of functional units) than the FREF clock. In the example presented in FIG. 27, the frequency ratio is approximately 4.6.

Figure 28:
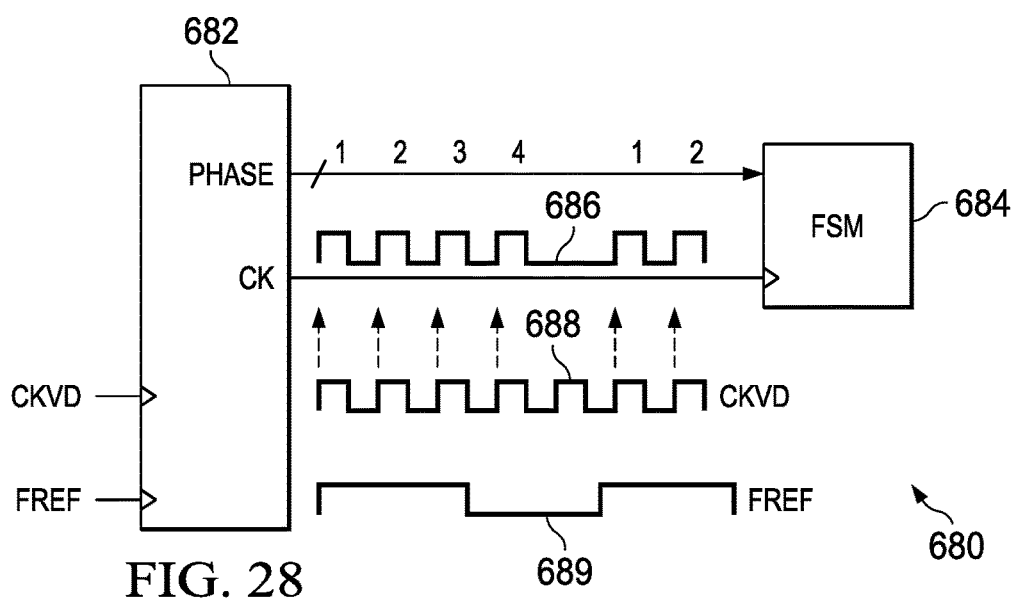
FIG. 28 is a block diagram illustrating a second example implementation of the state machine used to implement the software ADPLL of the present invention.

A block diagram illustrating a second example implementation of the state machine used to implement the software ADPLL of the present invention is shown in FIG. 28. The circuit, generally referenced 680, comprises clock and phase generator 682 and FSM 684. This figure presents the embodiment wherein the functionality of the various functional units (i.e. FSM1, FSM2, FSM3, FSM4) are merged into a single reconfigurable finite state machine (FSM). The FSM unit reprograms itself such that its functionality becomes one of the four units FSM1, FSM2, FSM3, FSM4 of FIG. 27. The determination of which unit the FSM 684 becomes is controlled by the "Phase" signal. The input and output connections between the functional units in FIG. 27 are now stored as state variables internal to the FSM, which now operates at a higher clock rate 688. The single clock line CK comprises gaps due to the non-integer frequency ratio of CKVD to FREF 689.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A reconfigurable calculation unit comprising:
   (a) an Ra input, an Rb input, an a input, and an Rd output;
   (b) a first shifter having an input coupled to the Ra input, an input coupled to the a input, and a shifted output;
   (c) a first adder having a shifted input coupled to the shifted output, a summed input, and a summed output coupled to the Rd output;

(d) a second adder having an input coupled to the Rb input, a shifted Rb input, and a summed output coupled to the summed input; and (e) a second shifter having an input coupled to the Rb input, an input coupled to the a input, and an output coupled to the shifted Rb input.

2. The reconfigurable calculation unit of claim 1 in which the reconfigurable calculation unit is an infinite impulse response filter.

3. The reconfigurable calculation unit of claim 1 in which the first shifter, first adder, second adder, and second shifter are digital components.

4. The reconfigurable calculation unit of claim 1 in which the Ra input, the Rb input, the a input, and the Rd output are all digital signals.

* * * * *